United States Patent
Kanda et al.

(10) Patent No.: US 8,241,833 B2
(45) Date of Patent: Aug. 14, 2012

(54) POSITIVE RESIST COMPOSITION AND PATTERN-FORMING METHOD USING THE SAME

(75) Inventors: Hiromi Kanda, Shizuoka (JP); Fumiyuki Nishiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/785,019

(22) Filed: May 21, 2010

(65) Prior Publication Data

US 2010/0297553 A1 Nov. 25, 2010

Related U.S. Application Data

(63) Continuation of application No. 11/245,136, filed on Oct. 7, 2005, now Pat. No. 7,811,740.

(30) Foreign Application Priority Data

| Oct. 8, 2004 | (JP) | ................................. 2004-295852 |
| Dec. 10, 2004 | (JP) | ................................. 2004-358699 |

(51) Int. Cl.
*G03C 1/00* (2006.01)
*G03C 7/00* (2006.01)
*G03F 7/00* (2006.01)

(52) U.S. Cl. ..................................... 430/270.1; 430/322
(58) Field of Classification Search .................. 556/446; 430/270.1; 522/42
See application file for complete search history.

(56) References Cited

U.S. PATENT DOCUMENTS

| 6,010,834 | A | 1/2000 | McGuckin et al. |
| 6,479,211 | B1 * | 11/2002 | Sato et al. .................. 430/270.1 |
| 6,645,692 | B2 * | 11/2003 | Namba ....................... 430/270.1 |
| 2002/0012874 | A1 | 1/2002 | Namba |
| 2002/0155383 | A1 | 10/2002 | Fujimori et al. |
| 2003/0031950 | A1 * | 2/2003 | Uenishi et al. .............. 430/270.1 |
| 2003/0207200 | A1 * | 11/2003 | Barclay et al. .............. 430/270.1 |
| 2004/0175654 | A1 | 9/2004 | Yasunami et al. |
| 2005/0019690 | A1 | 1/2005 | Kodama |
| 2005/0260528 | A1 * | 11/2005 | Kong et al. ....................... 430/322 |
| 2005/0266335 | A1 | 12/2005 | Johnson et al. |
| 2006/0008736 | A1 | 1/2006 | Kanda et al. |
| 2006/0154170 | A1 | 7/2006 | Endo et al. |
| 2007/0072112 | A1 * | 3/2007 | Prokopowicz et al. .... 430/270.1 |
| 2007/0190448 | A1 | 8/2007 | Ishiduka et al. |
| 2009/0181323 | A1 | 7/2009 | Kanda et al. |

FOREIGN PATENT DOCUMENTS

| EP | 0 952 489 A1 | 10/1999 |
| EP | 1 580 598 A2 | 9/2005 |
| EP | 1 621 927 A2 | 2/2006 |
| EP | 1 621 927 A3 | 4/2006 |
| JP | 63-49893 B2 | 10/1988 |
| JP | 6-124873 A | 5/1994 |
| JP | 10-303114 A | 11/1998 |
| JP | 2000338676 A | 12/2000 |
| JP | 2001-125259 A | 5/2001 |
| JP | 2002-006483 A | 1/2002 |
| JP | 2003-105207 A | 4/2003 |
| JP | 2005-284238 A | 10/2005 |

OTHER PUBLICATIONS

Japanese Notice of Reasons for Rejection dated Aug. 19, 2009.
Korean Patent Office Action issued in Korean Patent Application No. 10-2009-0110354 dated Jan. 8, 2010.
European Search Report dated Feb. 24, 2006.
www.omnova.com (Poly Fox® paper).
"New Technology Offers Green Light to Develop Better Coatings", Dr. Barry Rosenbaum, Paint & Coatings Industry, Nov. 1, 2002.
www.pcimag.com, Rosenbaum, Barry. "Novel Fluorinated Materials Replace Long Chain Surfactants", May 31, 2002, Omnova Solutions, Inc. pp. 1-9.
Office Action dated Aug. 29, 2011 in Taiwanese Patent Application No. 094134963.
Mulkens, J et al., "Benefits and limitations of immersion lithography", J. Microlith., Microfab., Microsyst., vol. 3, No. 1, Jan. 2004, pp. 104-114.
Office Action dated May 9, 2011 in European Application No. 05 021 938.5.
European Office Action issued Oct. 24, 2011 in corresponding European Application No. 05021938.5.

* cited by examiner

*Primary Examiner* — Cynthia Kelly
*Assistant Examiner* — Connie P Johnson
(74) *Attorney, Agent, or Firm* — Sughrue Mion, PLLC

(57) ABSTRACT

A positive resist composition comprising (A) resin having a monocyclic or polycyclic alicyclic hydrocarbon structure and capable of decomposing by the action of an acid to increase the solubility in an alkaline developer, (B) a compound capable of generating an acid upon treatment with one of an actinic ray and radiation and (F) a specific surfactant containing a fluorine atom in an amount of from 30 to 60 mass %, and a pattern-forming method using the same.

8 Claims, 1 Drawing Sheet

POSITIVE RESIST COMPOSITION AND PATTERN-FORMING METHOD USING THE SAME

This is a continuation of application Ser. No. 11/245,136 filed Oct. 7, 2005 now U.S. Pat. No. 7,811,740. The entire disclosure of the prior application, application Ser. No. 11/245,136, is hereby incorporated by reference.

BACKGROUND OF THE INVENTION

1. Field of the Invention

The present invention relates to a positive resist composition used in a manufacturing process of semiconductor devices, such as IC, manufacture of circuit substrates for liquid crystals, thermal heads and the like, and lithographic processes of other photo-fabrication, and also the invention relates to a pattern-forming process using the same. In particular, the invention relates to a positive resist composition suitable for exposure by an immersion projection exposure apparatus with far ultraviolet rays of the wavelength of 300 nm or less as the light source, and a pattern-forming process using the positive resist composition.

2. Description of the Related Art

With the progress of fining of semiconductor elements, shortening of the wavelengths of exposure light source and increasing of the numerical aperture (high NA) of projection lens have advanced, and now exposure apparatus of NA 0.84 using an ArF excimer laser having the wavelength of 193 nm as the light source have been developed, which can be expressed by the following equations as generally known:

(Resolution)=$k_1 \cdot (\lambda/NA)$ (Depth of focus)=$\pm k_2 \cdot \lambda/NA^2$ wherein $\lambda$ is the wavelength of exposure light source, NA is the numerical aperture of the projection lens, and $k_1$ and $k_2$ are the coefficients concerning the process.

For further higher resolution by the shortening of wavelengths, an exposure apparatus with an $F_2$ excimer laser having the wavelength of 157 nm as the light source has been studied, but the materials of lens for use in the exposure apparatus for the shortening of wavelengths and the materials of photoresist are extremely restricted, so that the realization of the reasonable manufacturing costs of the apparatus and materials and quality stabilization are very difficult, as a result, there are possibilities of missing an exposure apparatus and a photoresist having sufficient performances and stabilities within a required period of time.

As a technique for increasing resolution in optical microscopes, a so-called immersion method of filling a liquid of high refractive index (hereinafter sometimes referred to as "immersion liquid") between a projection lens and a sample has been conventionally known.

As "the effect of immersion", the above resolution and depth of focus can be expressed by the following equations in the case of immersion, with $\lambda_0$ as the wavelength of the exposure light in the air, n as the refractive index of immersion liquid to the air, and $NA_0$=$\sin \theta$ with $\theta$ as convergence half angle of the ray of light:

(Resolution)=$k_1 \cdot (\lambda_0/n)/NA_0$ (Depth of focus)=$\pm k_2 \cdot (\lambda_0/n)/NA_0^2$ That is, the effect of immersion is equivalent to the case of using exposure wavelength of the wavelength of 1/n. In other words, in the case of the projection optical system of the same NA, the depth of focus can be made n magnifications by immersion. This is effective for every pattern form, and further, this can be combined with super resolution techniques such as a phase shift method and a deformation lighting method now under discussion.

As the example of the application of this effect to the formation of micro-fine image pattern of semiconductor element, JP-B-63-49893 (the term "JP-B" as used herein refers to an "examined Japanese patent publication") and JP-A-6-124873 (the term "JP-A" as used herein refers to an "unexamined published Japanese patent application") are known, but resists suitable for immersion exposure techniques are not disclosed in these patents.

It is appointed in JP-A-10-303114 that the control of the refractive index of an immersion liquid is important, since the variation of the refractive index of an immersion liquid causes the deterioration of a projected image due to the wave surface aberration of exposure apparatus, and controlling the temperature coefficient of the refractive index of an immersion liquid to a certain range, and water added with additives for reducing surface tension or increasing the degree of surface activity are disclosed as a preferred immersion liquid. However, the specific additives are not disclosed and resists suitable for the technique of immersion exposure are not also discussed.

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

The resist for ArF excimer laser (193 nm) using the mechanism of chemical amplification is now becoming the main stream, but the resist is not sufficient in performance for development defects occurring after development, and further improvement is required.

In addition, when chemical amplification resist is applied to the immersion exposure technique for further fine pattern forming, the acid on the surface of the resist generated at the time of exposure migrates to the immersion liquid, and the acid concentration on the exposed surface changes. This phenomenon is thought very similar to the acid deactivation of the surface of the exposed area caused by basic contamination of a trace amount of several ppb level from the environment at the time of post exposure time delay (PED) between exposure and PEB, which became an issue at the beginning of the development of a chemical amplification positive resist, but the influence of immersion exposure on a resist and its mechanism are still unclear. When a chemical amplification resist that causes no lithographic problem in general dry exposure is subjected to immersion exposure, there are problems that depth of focus (hereinafter referred to as "DOF") as the degree of allowance to focus variation and profile deteriorate.

Further, in performing exposure with a scanning system immersion exposing apparatus as described in OPTRONICS No. 4 2003 in immersion exposure process, exposure speed lowers if the immersion liquid does not transfer following the transfer of the lens, so that there is the fear that the productivity is influenced. When the immersion liquid is water, a resist film is preferably hydrophobic for the follow-up ability of water, on the other hand when a resist film is hydrophobitized, image performance of the resist is adversely influenced such as by the increase of the occurrence of scum, and so the improvement is required.

SUMMARY OF THE INVENTION

In view of the problems of the related art as described above, the objects of the invention are to provide a positive resist composition improved in performance for development defects by general exposure, and to provide a pattern-forming method using the same.

Further objects of the invention are to provide a positive resist composition free from the deterioration of DOF and profile when applied to immersion exposure, and to provide a pattern-forming method using the same.

Still further objects of the invention are to provide a positive resist composition having good follow-up ability of water, restrained in the occurrence of scum and suitable for immersion exposure, and to provide a pattern-forming method using the same.

The invention is as follows.

(1) A positive resist composition comprising:

(A) a resin having a monocyclic or polycyclic alicyclic hydrocarbon structure and capable of decomposing by an action of an acid to increase a solubility of the resin in an alkaline developer;

(B) a compound capable of generating an acid upon treatment with one of an actinic ray and radiation; and (F) a surfactant containing a fluorine atom in an amount of from 30 to 60 mass %.

(2) The positive resist composition as described in (1) above, wherein the surfactant of component (F) is represented by formula (1):

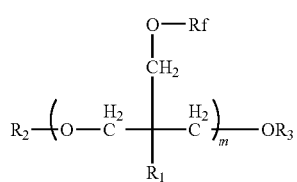

wherein $R_1$ represents a hydrogen atom or an alkyl group;

$R_2$ and $R_3$ each independently represents a hydrogen atom, an alkyl group, an alkylcarbonyl group or a lactone group;

Rf represents a fluoroalkyl group or a fluoroalkylcarbonyl group; and m represents an integer of from 1 to 50.

(3) The positive resist composition as described in (1) or (2) above, wherein the resin of component (A) comprises at least one repeating unit selected from the group consisting of: a repeating unit having a partial structure containing an alicyclic hydrocarbon represented by any of formulae (pI) to (pVI); and a repeating unit represented by formula (II-AB):

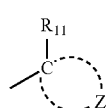

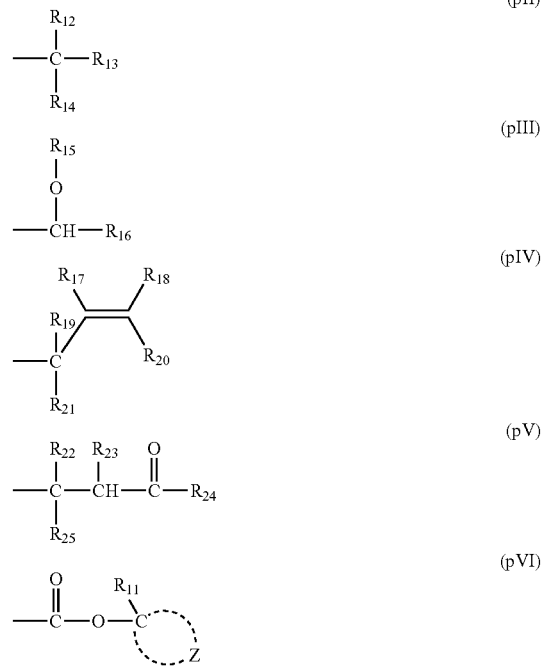

wherein $R_{11}$ represents a methyl group, an ethyl group, an n-propyl group, an isopropyl group, an n-butyl group, an isobutyl group or a sec-butyl group;

Z represents an atomic group necessary to form an alicyclic hydrocarbon group with a carbon atom;

$R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group;

$R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$, $R_{23}$, $R_{24}$ and $R_{25}$ each independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring;

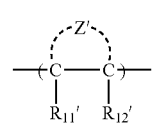

wherein $R_{11}'$ and $R_{12}'$ each independently represents a hydrogen atom, a cyano group, a halogen atom or an alkyl group; and Z' contains bonded two carbon atoms (C—C) and represents an atomic group for forming an alicyclic structure.

(4) The positive resist composition as described in any of (1) to (3) above, which is utilized for an immersion exposure.

(5) The positive resist composition as described in (4) above, wherein the resin of component (A) has properties (i) and (ii):

(i) the resin comprises a repeating unit having at least one lactone structure; and (ii) a portion, which detaches from the resin of component (A) by an action of an acid, has an alicyclic hydrocarbon structure.

(6) The positive resist composition as described in (4) or (5) above, wherein when a resist film is formed, a contact angle of the resist film with an immersion liquid is 75° or more.

(7) A pattern-forming method comprising:

forming a resist film with a positive resist composition as described in any of (1) to (3) above;

exposing the resist film, so as to form an exposed resist film; and developing the exposed resist film.

(8) A pattern-forming method comprising:

forming a resist film with a positive resist composition as described in any of (4) to (6) above;

exposing the resist film via an immersion liquid, so as to form an exposed resist film; and developing the exposed resist film.

DETAILED DESCRIPTION OF THE INVENTION

Figure 1:
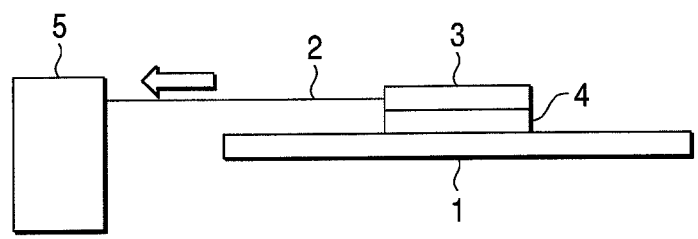
FIG. 1 is a schematic view showing the state of evaluating the follow-up ability of water to the quartz plate.

The invention is described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] (A) Resin Having a Monocyclic or Polycyclic Alicyclic Hydrocarbon Structure and Capable of Decomposing by the Action of an Acid to Increase the Solubility in an Alkaline Developer:

The positive resist composition in the invention contains (A) resin having a monocyclic or polycyclic alicyclic hydrocarbon structure and capable of decomposing by the action of an acid to increase the solubility in an alkaline developer.

The resin of component (A) has groups decomposed by the action of an acid and capable of forming a carboxyl group or a hydroxyl group (hereinafter sometimes referred to as "acid-decomposable groups"), and it is preferred that at least one of acid-decomposable groups is a group represented by the following formula (I).

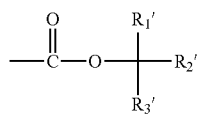
(I)

In formula (I), $R_1'$, $R_2'$ and $R_3'$ each independently represents an alkyl group, a cycloalkyl group or an alkenyl group.

As the alkyl groups represented by $R_1'$ to $R_3'$, alkyl groups having from 1 to 8 carbon atoms are preferred and, e.g., a methyl group, an ethyl group, a propyl group, an n-butyl group, a sec-butyl group, a 2-hexyl group and an octyl group can be exemplified.

The cycloalkyl groups represented by $R_1'$ to $R_3'$ may be monocyclic or polycyclic, and specifically groups having a monocyclic, bicyclic, tricyclic or tetracyclic structure having 5 or more carbon atoms can be exemplified. The number of carbon atoms is preferably from 6 to 30, and especially preferably from 7 to 25.

As the preferred examples of the cycloalkyl groups, an adamantyl group, a noradmantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. The more preferred examples are an adamantyl group, a decalin residue, a norbornyl group, a cedrol group, a cyclohexyl group, a cycloheptyl group, a cyclooctyl group, a cyclodecanyl group, and a cyclododecanyl group. Further, a part of the hydrocarbon in the cycloalkyl groups may be substituted with a hetero atom, e.g., an oxygen atom.

As the alkenyl groups represented by $R_1'$ to $R_3'$, alkenyl groups having from 2 to 8 carbon atoms are preferred and, e.g., a vinyl group, an allyl group, a butenyl group and a cyclohexenyl group can be exemplified.

The alkyl groups, cycloalkyl groups and alkenyl groups represented by $R_1'$ to $R_3'$ may have a substituent. As the substituents, e.g., an alkyl group, a halogen atom, a hydroxyl group, an alkoxyl group, a carboxyl group, an alkoxycarbonyl group, a cyano group and an ester group can be exemplified. As the alkyl groups, lower alkyl groups, e.g., a methyl group, an ethyl group, a propyl group, an isopropyl group and a butyl group are preferred, and more preferred are a methyl group, an ethyl group, a propyl group and an isopropyl group. As the alkoxyl groups, alkoxyl groups having from 1 to 4 carbon atoms, e.g., a methoxy group, an ethoxy group, a propoxy group and a butoxy group can be exemplified. These alkyl groups and alkoxyl groups may further have a substituent and, e.g., a hydroxyl group, a halogen atom and an alkoxyl group can be exemplified as the further substituents of the alkyl groups and alkoxyl groups.

$R_1'$ to $R_3'$ may be linked to each other to form a ring, and $R_1'$ to $R_3'$ may be linked via a hetero atom such as an oxygen atom.

The acid-decomposable group represented by formula (I) is preferably contained as a repeating unit represented by the following formula (pA).

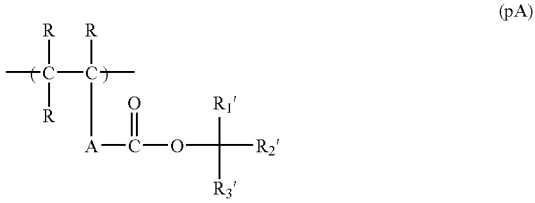
(pA)

In formula (pA), R represents a hydrogen atom, a halogen atom, or a straight chain or branched alkyl group having from 1 to 4 carbon atoms. A plurality of R's may be the same or different.

A represents a single bond, or a single group or a combination of two or more groups selected from the group consisting of an alkylene group, an ether group, a thioether group, a carbonyl group, an ester group, an amido group, a sulfonamido group, a urethane group and a urea group. The alkylene group may have a substituent.

$R_1'$ to $R_3'$ have the same meaning as $R_1'$ to $R_3'$ in formula (I).

The repeating unit represented by (pA) is preferably a repeating unit in which at least one of $R_1'$ to $R_3'$ represents a cycloalkyl group, or at least two of $R_1'$ to $R_3'$ are bonded to form a cycloalkyl group.

The repeating unit represented by formula (pA) is more preferably a repeating unit by 2-alkyl-2-adamantyl(meth)acrylate or dialkyl(1-adamantyl)methyl(meth)acrylate.

The specific examples of the repeating units represented by formula (pA) are shown below.
(In the formulae, Rx represents H, $CH_3$ or $CF_3$.)

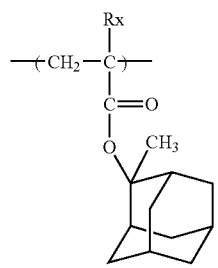
1

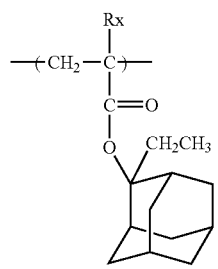
2

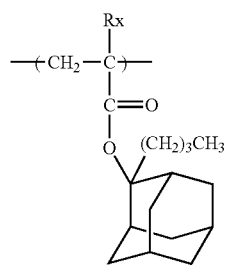
3

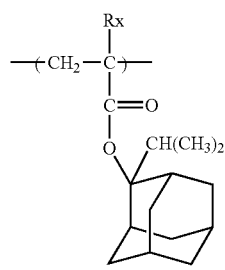
4

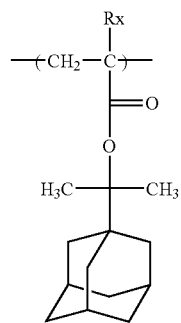
5

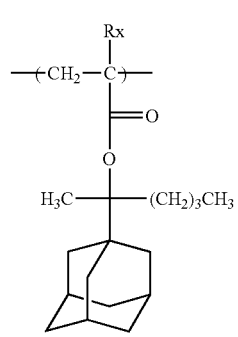
6

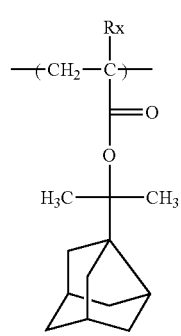
7

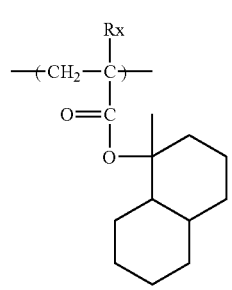
8

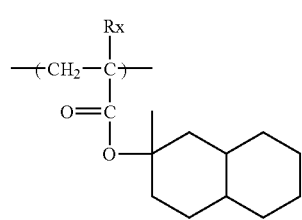
9

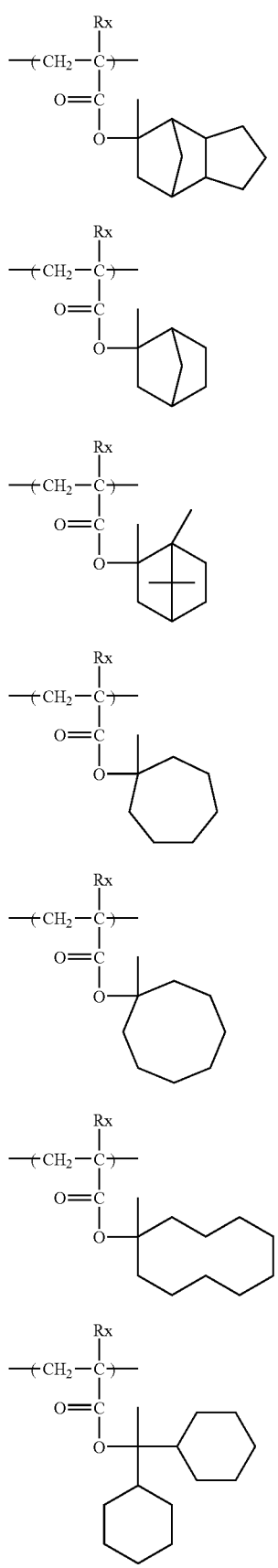

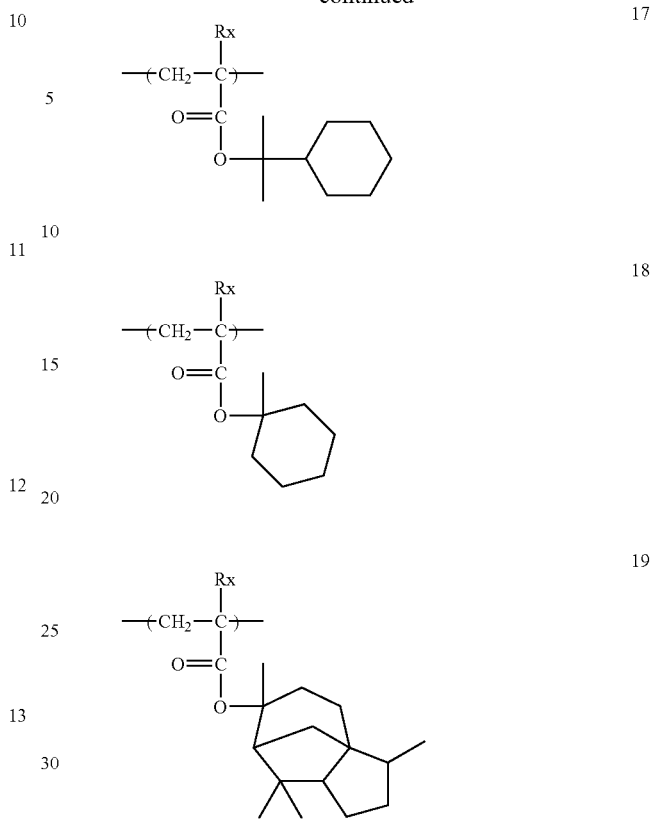

In the resin of component (A), the content of the repeating unit having an acid-decomposable group is preferably from 10 to 70 mol % in all the repeating units, more preferably from 20 to 65 mol %, and still more preferably from 25 to 50 mol %.

The acid-decomposable group of the resin of component (A) may comprise a group represented by formula (I) alone, or other acid-decomposable group may be used in combination.

The resin of component (A) is preferably a resin having a monocyclic or polycyclic alicyclic hydrocarbon structure and capable of decomposing by the action of an acid to increase the solubility in an alkaline developer (hereinafter sometimes referred to as "alicyclic hydrocarbon-based acid-decomposable resin"), and it is preferred to have at least one repeating unit selected from the group consisting of a repeating unit having a partial structure containing alicyclic hydrocarbon represented by any of the following formulae (pI) to (pVI), and a repeating unit represented by the following formula (II-AB):

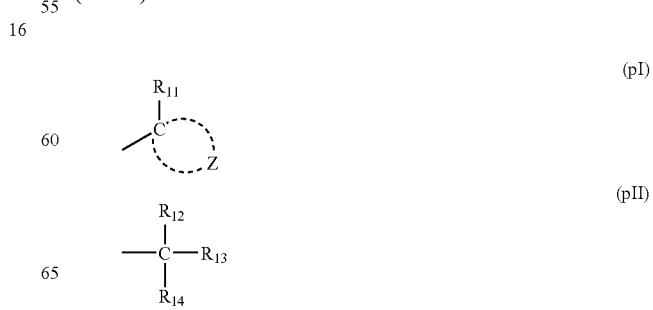

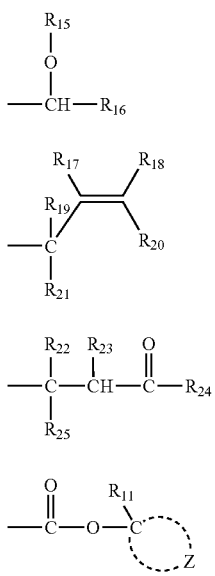

(pIII)

(pIV)

(pV)

(pVI)

In formulae (pI) to (pVI), $R_{11}$ represents a methyl group, an ethyl group, an n-propyl group, an isopropyl group, an n-butyl group, an isobutyl group, or a sec-butyl group, Z represents an atomic group necessary to form an alicyclic hydrocarbon group with a carbon atom.

$R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

$R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group.

$R_{22}$, $R_{23}$, $R_{24}$ and $R_{25}$ each independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

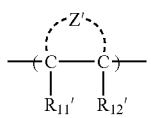

(II-AB)

In formula (II-AB), $R_{11}'$ and $R_{12}'$ each independently represents a hydrogen atom, a cyano group, a halogen atom, or an alkyl group.

Z' contains bonded two carbon atoms (C—C) and represents an atomic group for forming an alicyclic structure.

Formula (II-AB) is more preferably represented by the following formula (II-A) or (II-B).

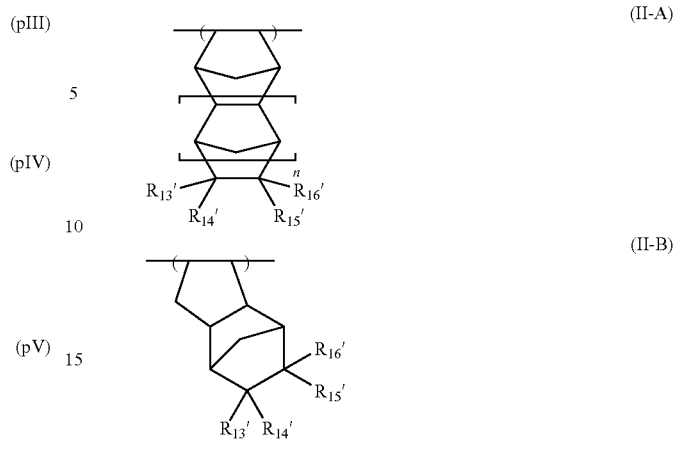

In formulae (II-A) and (II-B) $R_{13}'$, $R_{14}'$, $R_{15}'$ and $R_{16}'$ each independently represents a hydrogen atom, a halogen atom, a cyano group, —COOH, —COOR$_5$, a group decomposing by the action of an acid, —C(=O)—X-A'—$R_{17}'$, an alkyl group, or a cyclic hydrocarbon group. At least two of $R_{13}'$ to $R_{16}'$ may be bonded to each other to form a ring.

$R_5$ represents an alkyl group, a cyclic hydrocarbon group, or —Y group shown below.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxyl group, —CO—NH—$R_6$, —CO—NH—SO$_2$—$R_6$, or —Y group shown below.

$R_6$ represents an alkyl group or a cyclic hydrocarbon group.

n represents 0 or 1.

—Y group.

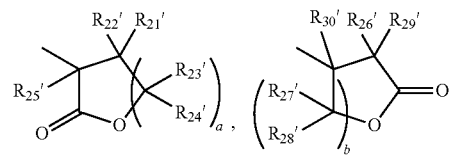

In —Y group, $R_{21}'$ to $R_{30}'$ each independently represents a hydrogen atom or an alkyl group which may have a substituent.

a and b each independently represents 1 or 2.

In formulae (pI) to (pVI), the alkyl group represented by $R_{12}$ to $R_{25}$ may be a substituted or unsubstituted, and represents a straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of further substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The alicyclic hydrocarbon groups represented by $R_{11}$ to $R_{25}$ or the alicyclic hydrocarbon group formed by Z and carbon atoms may be monocyclic or polycyclic. Specifically, groups having a monocyclic, bicyclic, tricyclic or tetracyclic structure having 5 or more carbon atoms can be exemplified. The number of carbon atoms is preferably from 6 to 30, and particularly preferably from 7 to 25. These alicyclic hydrocarbon groups may have a substituent.

As preferred alicyclic hydrocarbon groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. The more preferred groups are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these alicyclic hydrocarbon groups, an alkyl group, a halogen atom, a hydroxyl group, an alkoxyl group, a carboxyl group and an alkoxycarbonyl group can be exemplified. As the alkyl groups, lower alkyl groups, e.g., a methyl group, an ethyl group, a propyl group, an isopropyl group and a butyl group are preferred, and more preferably a methyl group, an ethyl group, a propyl group and an isopropyl group are exemplified. As the alkoxyl groups, alkoxyl groups having from 1 to 4 carbon atoms, e.g., a methoxy group, an ethoxy group, a propoxy group and a butoxy group can be exemplified. The alkyl group and alkoxyl group may further have a substituent, e.g., a hydroxyl group, a halogen atom and an alkoxyl group can be exemplified as further substituents of the alkyl group and alkoxyl group.

The structures represented by formulae (pI) to (pVI) can be used for the protection of alkali-soluble groups. As the alkali-soluble groups, various groups well known in this technical field can be exemplified.

Specifically, as the alkali-soluble groups, a carboxylic acid group, a sulfonic acid group, a phenol group and a thiol group are exemplified, preferably a carboxylic acid group and a sulfonic acid group.

As the alkali-soluble groups protected with any of the structures represented by formulae (pI) to (pVI), structures in which the hydrogen atom of a carboxyl group is substituted with the structures represented by formulae (pI) to (pVI) are preferably exemplified.

As the structures in which the hydrogen atom of a carboxyl group is substituted with the structures represented by formulae (pI) to (pVI), e.g., a structures represented by formula (I) in which at least one of $R^{1'}$ to $R^{3'}$ represents a cycloalkyl group, or at least two of $R^{1'}$ to $R^{3'}$ are bonded to form a cycloalkyl group can be exemplified.

As the repeating units having the structure in which the hydrogen atom of a carboxyl group is substituted with the structures represented by formulae (pI) to (pVI), e.g., a repeating units represented by formula (pA) in which at least one of $R^{1'}$ to $R^{3'}$ represents a cycloalkyl group, or at least two of $R^{1'}$ to $R^{3'}$ are bonded to form a cycloalkyl group can be exemplified.

As the specific examples of the repeating units having the structure in which the hydrogen atom of a carboxyl group is substituted with the structures represented by formulae (pI) to (pVI), the above-shown examples (1) to (19) are exemplified.

In formula (II-AB), $R_{11}'$ and $R_{12}'$ each independently represents a hydrogen atom, a cyano group, a halogen atom, or an alkyl group which may have a substituent.

Z' contains bonded two carbon atoms (C—C) and represents an atomic group for forming an alicyclic structure which may have a substituent.

As the halogen atoms represented by $R_{11}'$ and $R_{12}'$, a chlorine atom, a bromine atom, a fluorine atom and an iodine atom are exemplified.

As the alkyl groups represented by $R_{11}'$ and $R_{12}'$, straight chain or branched alkyl groups having from 1 to 10 carbon atoms are preferred, more preferably straight chain or branched alkyl groups having from 1 to 6 carbon atoms, and still more preferably a methyl group, an ethyl group, a propyl group, an isopropyl group, an n-butyl group, an isobutyl group, a sec-butyl group and a t-butyl group are exemplified.

As further substituents of the alkyl group, a hydroxyl group, a halogen atom, a carboxyl group, an alkoxyl group, an acyl group, a cyano group and an acyloxy group can be exemplified. As the halogen atoms, a chlorine atom, a bromine atom, a fluorine atom, and an iodine atom can be exemplified, as the alkoxyl group, alkoxyl groups having from 1 to 4 carbon atoms, e.g., a methoxy group, an ethoxy group, a propoxy group and a butoxy group can be exemplified, as the acyl groups, e.g., a formyl group and an acetyl group can be exemplified, and as the acyloxy group, an acetoxy group can be exemplified.

The atomic group represented by Z' to form an alicyclic structure is an atomic group for forming a repeating unit of alicyclic hydrocarbon, which may have a substituent, in a resin, and an atomic group to form a crosslinking alicyclic structure forming a crosslinking alicyclic hydrocarbon repeating unit is particularly preferred.

As the skeleton of alicyclic hydrocarbon formed, the same alicyclic hydrocarbon groups as represented by $R_{12}$ to $R_{25}$ in formulae (pI) to (pVI) are exemplified.

The skeleton of the alicyclic hydrocarbon may have a substituent, and the groups represented by $R_{13}'$ to $R_{16}'$ in formula (II-A) or (II-B) can be exemplified as the substituents.

Of the repeating units having crosslinking alicyclic hydrocarbon, the repeating units represented by formula (II-A) or (II-B) are more preferred.

In the alicyclic hydrocarbon-based acid-decomposable resin in the invention, the acid-decomposable group may be contained in —C(=O)—X-A'—$R_{17}'$, or may be contained as the substituent of Z' in formula (II-AB).

The structure of the acid-decomposable group is represented by formula —C(=O)—$X_1$—$R_0$.

In the formula, $R_0$ represents a tertiary alkyl group, e.g., a t-butyl group or a t-amyl group; an isoboronyl group; a 1-alkoxyethyl group, e.g., a 1-ethoxyethyl group, a 1-butoxyethyl group, a 1-isobutoxyethyl group, or a 1-cyclohexyloxyethyl group; an alkoxymethyl group, e.g., a 1-methoxymethyl group or a 1-ethoxymethyl group; a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone residue. $X_1$ has the same meaning as X above.

As the halogen atoms represented by $R_{13}'$, $R_{14}'$, $R_{15}'$ and $R_{16}'$ in formulae (II-A) and (II-B), a chlorine atom, a bromine atom, a fluorine atom and an iodine atom can be exemplified.

The alkyl groups represented by $R_{13}'$ to $R_{16}'$, $R_5$, $R_6$, $R_{21}'$ to $R_{30}'$ are preferably straight chain or branched alkyl groups having from 1 to 10 carbon atoms, more preferably straight chain or branched alkyl groups having from 1 to 6 carbon atoms, and still more preferably a methyl group, an ethyl group, a propyl group, an isopropyl group, an n-butyl group, an isobutyl group, a sec-butyl group and t-butyl.

The cyclic hydrocarbon groups represented by $R_{13}'$ to $R_{16}'$ $R_5$ and $R_6$ are, e.g., monocyclic cycloalkyl groups and crosslinking hydrocarbons, and a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclo-pentenyl group, a norbornanepoxy group, a menthyl group, an isomenthyl group, a neomenthyl group, and a tetracyclo-dodecanyl group can be exemplified.

As the rings formed by the bonding of at least two of $R_{13}'$ and $R_{16}'$, rings having from 5 to 12 carbon atoms, e.g., cyclopentene, cyclohexene, cycloheptane and cyclooctane can be exemplified.

As the alkoxyl group represented by $R_{17}'$, alkoxyl groups having from 1 to 4 carbon atoms, e.g., a methoxy group, an ethoxy group, a propoxy group and a butoxy group can be exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group, and a cyclic hydrocarbon group can be exemplified. As the halogen atoms, a chlorine atom, a bromine atom, a fluorine atom and an iodine atom can be exemplified, as the alkoxyl groups, alkoxyl groups having from 1 to 4 carbon atoms, e.g., a methoxy group, an ethoxy group, a propoxy group and a butoxy group can be exemplified, as the acyl groups, e.g., a formyl group and an acetyl group can be exemplified, and as the acyloxy group, an acetoxy group can be exemplified.

As the alkyl groups and cyclic hydrocarbon groups, the same as those described above can be exemplified.

As the divalent linking group represented by A', a single group or combinations comprising two or more groups selected from the group consisting of an alkylene group, an ether group, a thioether group, a carbonyl group, an ester group, an amido group, a sulfonamido group, a urethane group and a urea group. The alkylene group may have a substituent.

In the alicyclic hydrocarbon-based acid-decomposable resin in the invention, a group capable of decomposing by the action of an acid can be contained in at least one repeating unit of a repeating unit having a partial structure containing alicyclic hydrocarbon represented by any of formulae (pI) to (pVI), a repeating unit represented by formula (II-AB), and a repeating unit of the later-described copolymer component.

Various substituents of $R_{13}'$ to $R_{16}'$ in formula (II-A) or (II-B) can also be used as the substituents of the atomic group to form an alicyclic structure in formula (II-AB), or atomic group Z to form a crosslinking alicyclic structure.

The specific examples of the repeating units represented by formula (II-A) or (II-B) are shown below, but the invention is not limited to these specific examples.

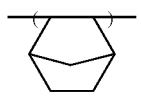
[II-1]

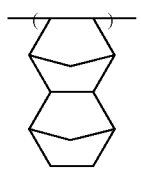
[II-2]

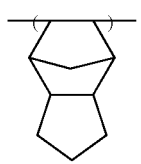
[II-3]

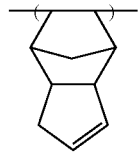
[II-4]

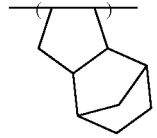
[II-5]

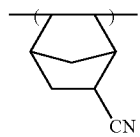
[II-6]

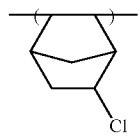
[II-7]

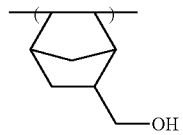
[II-8]

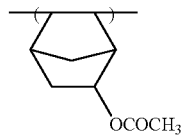
[II-9]

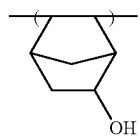
[II-10]

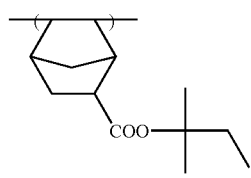
[II-11]

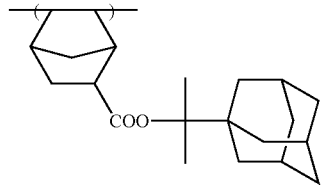
[II-12]

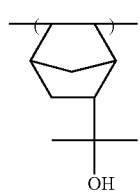
[II-13]

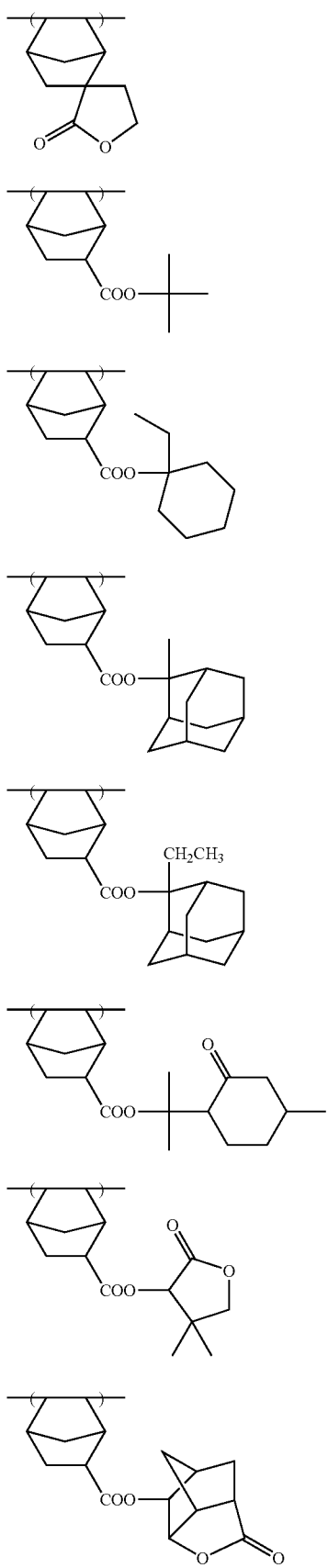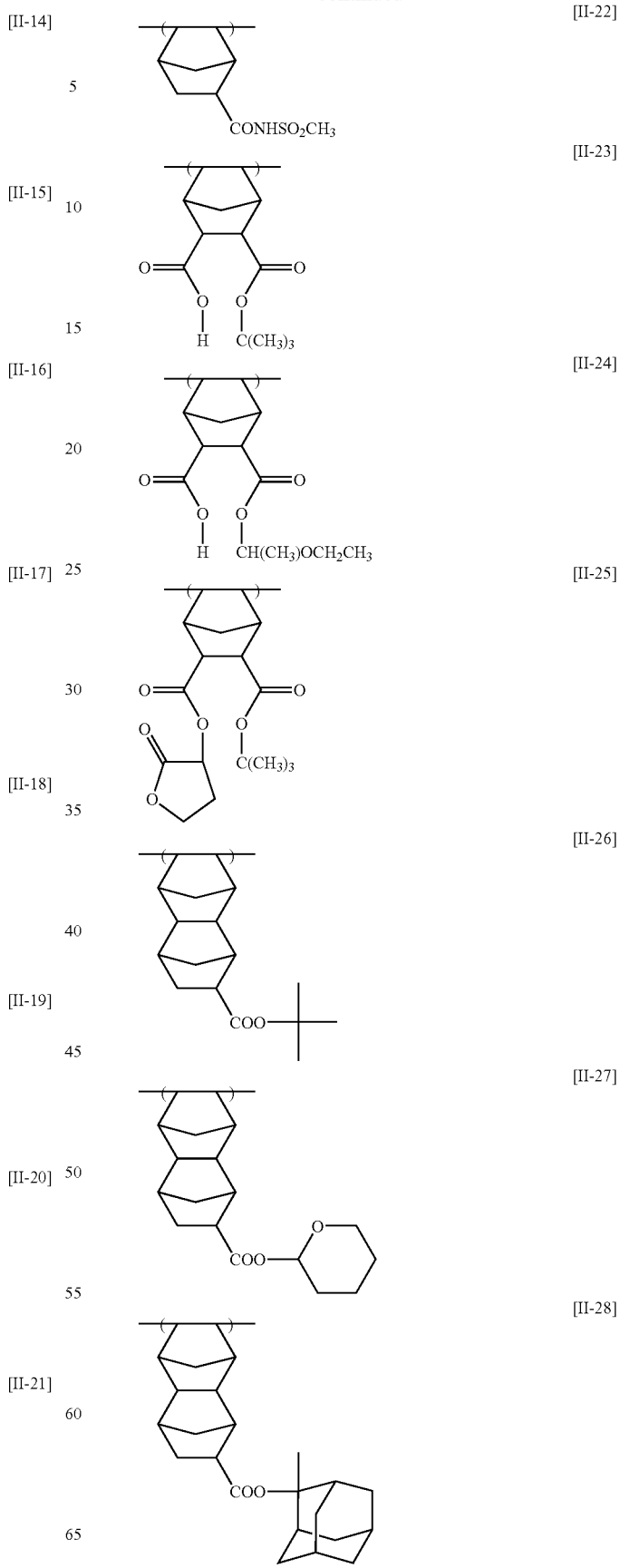

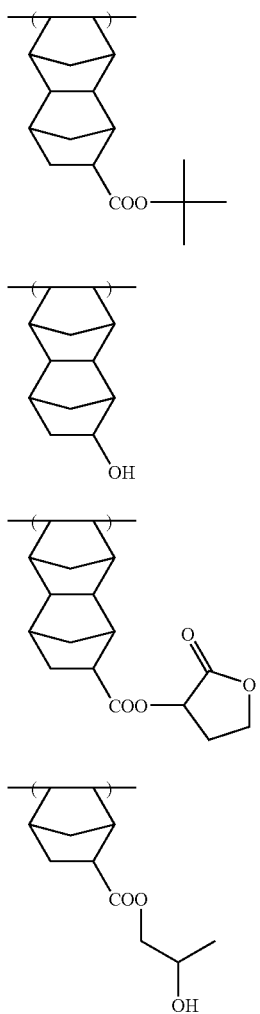

The alicyclic hydrocarbon-based acid-decomposable resin in the invention preferably has a lactone group, more preferably has a repeating unit having a group having a lactone structure represented by the following formula (Lc) or any of formulae (V-1) to (V-5). The group having a lactone structure may be directly bonded to the main chain.

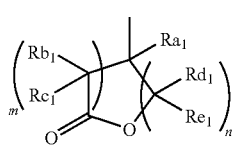

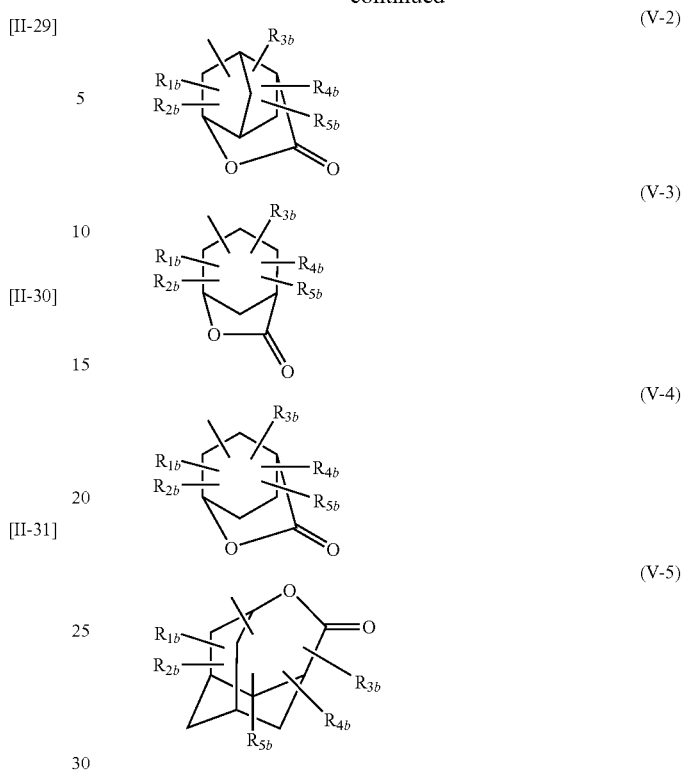

In formula (Lc), $Ra_1$, $Rb_1$, $Rc_1$, $Rd_1$ and $Re_1$ each independently represents a hydrogen atom or an alkyl group; m and n each independently represents an integer of from 0 to 3, and m+n is from 2 to 6.

In formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group or an alkenyl group. Two of $R_{1b}$ to $R_{5b}$ may be bonded to form a ring.

As the alkyl groups represented by $Ra_1$ to $Re_1$ in formula (Lc), and the alkyl groups in the alkyl groups, alkoxyl groups, alkoxycarbonyl groups and alkylsulfonylimino groups represented by $R_{1b}$ to $R_{5b}$ in formulae (V-1) to (V-5), straight chain or branched alkyl groups are exemplified, and these alkyl groups may have a substituent.

As the repeating units having a group having a lactone structure represented by formula (Lc) or any of formulae (V-1) to (V-5), a repeating unit represented by formula (II-A) or (II-B) in which at least one of $R_{13}'$ to $R_{16}'$ has a group represented by formula (Lc) or any of formulae (V-1) to (V-5) (for example, $R_5$ in —$COOR_5$ represents a group represented by formula (Lc) or any of formulae (V-1) to (V-5)), or a repeating unit represented by the following formula (AI) can be exemplified.

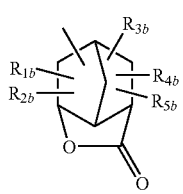

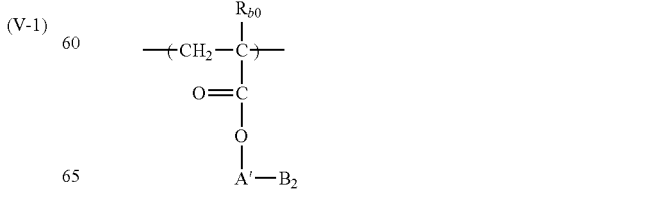

In formula (AI), $R_{b0}$ represents a hydrogen atom, a halogen atom, or an alkyl group having from 1 to 4 carbon atoms. The alkyl group represented by $R_{b0}$ may have a substituent.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group combining these groups.

$B_2$ represents a group represented by formula (Lc) or any of formulae (V-1) to (V-5).

The specific examples of repeating units having a group having a lactone structure are shown below, but the invention is not limited thereto.

(In the formulae, Rx represents H, $CH_3$ or $CF_3$.)

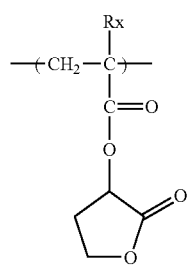
(IV-1)

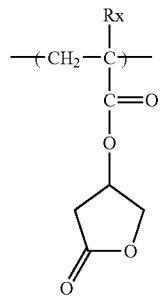
(IV-2)

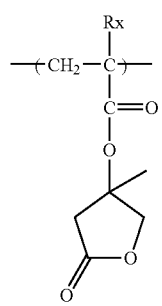
(IV-3)

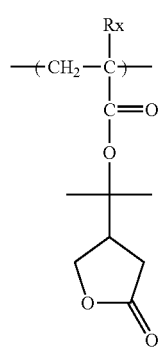
(IV-4)

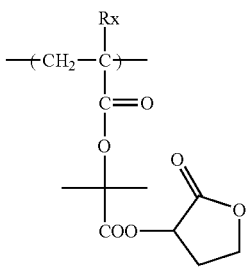
(IV-5)

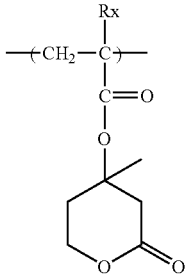
(IV-6)

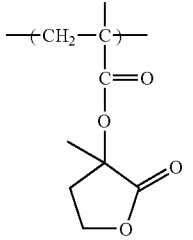
(IV-7)

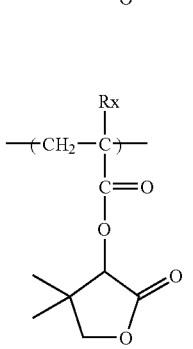
(IV-8)

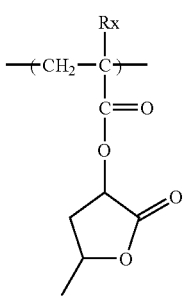
(IV-9)

(IV-10)
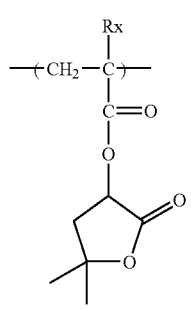
(IV-11)
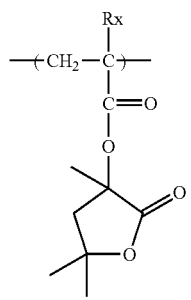
(IV-12)
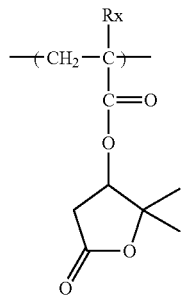
(IV-13)
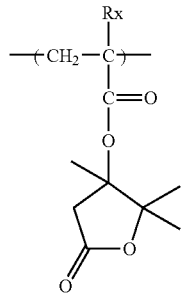
(IV-14)
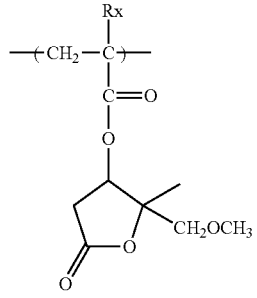
(IV-15)
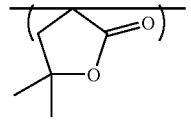
(IV-16)
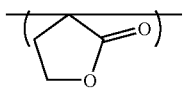
(In the formulae, Rx represents H, CH$_3$ or CF$_3$.)
(Ib-1)
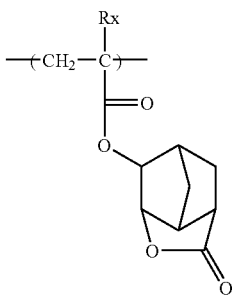
(Ib-2)
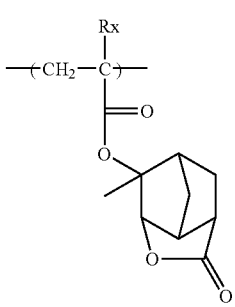
(Ib-3)
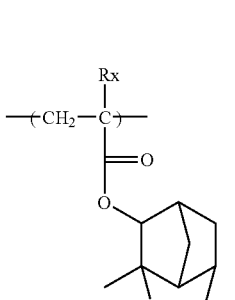
(Ib-4)
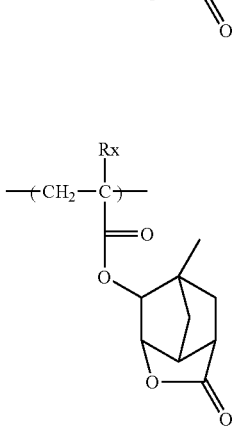

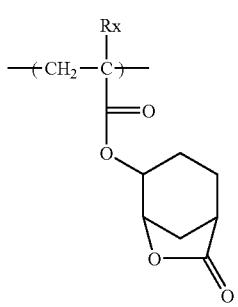 (Ib-5)
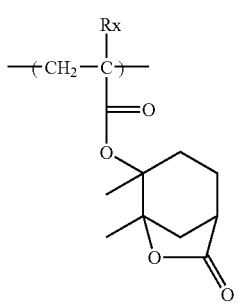 (Ib-6)
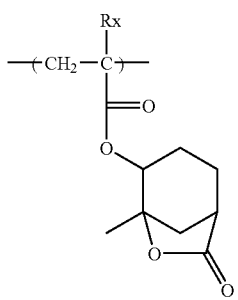 (Ib-7)
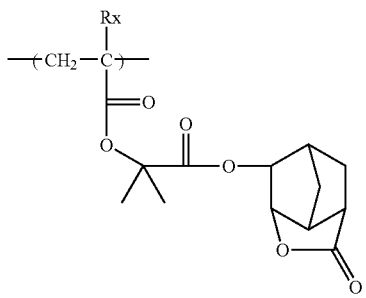 (Ib-8)
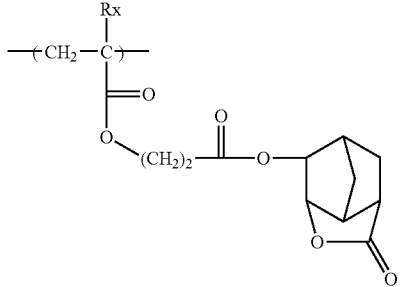 (Ib-9)
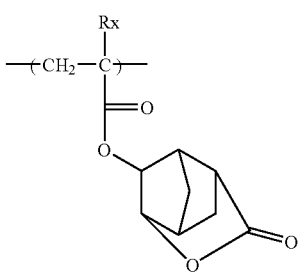 (Ib-10)
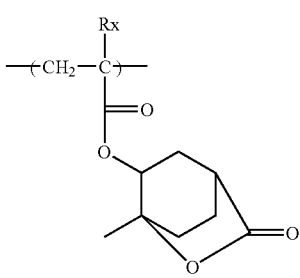 (Ib-11)
(In the formulae, Rx represents H, $CH_3$ or $CF_3$.)
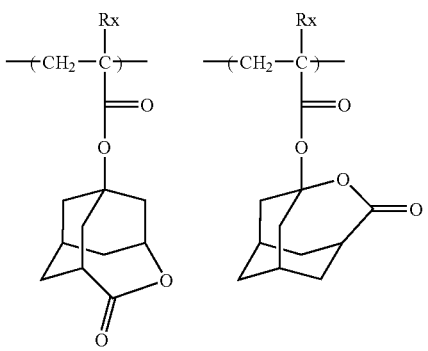
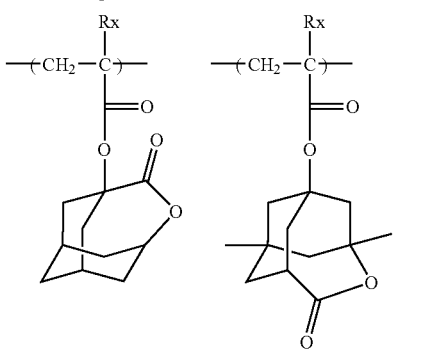
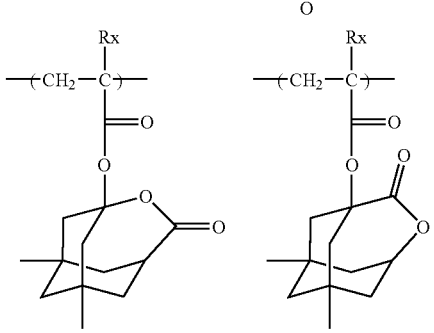

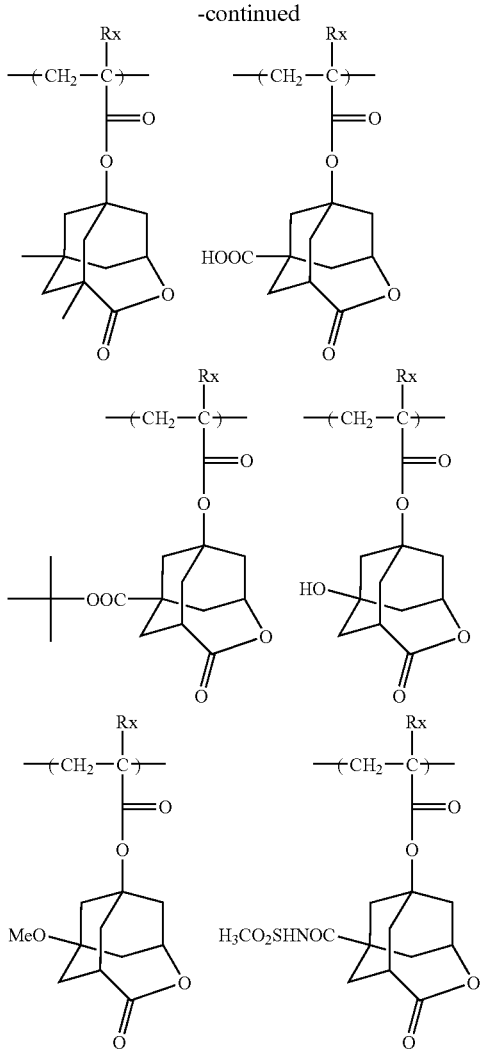

The alicyclic hydrocarbon-based acid-decomposable resin in the invention may contain a repeating unit having a group represented by the following formula (VII).

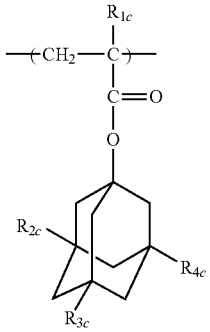

(VII)

In formula (VII), $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

The group represented by formula (VII) is preferably a dihydroxy body or a monohydroxy body, more preferably a dihydroxy body.

As the repeating unit having a group represented by formula (VII), a repeating unit represented by formula (II-A) or (II-B) in which at least one of $R_{13}'$ to $R_{16}'$ has a group represented by formula (VII) (for example, $R_5$ in —COOR$_5$ represents a group represented by formula (VII)), or a repeating unit represented by the following formula (AII) can be exemplified.

(AII)

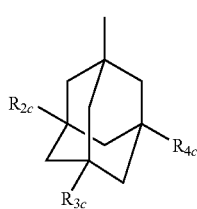

In formula (AII), $R_{1c}$ represents a hydrogen atom or a methyl group.

$R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not limited thereto.

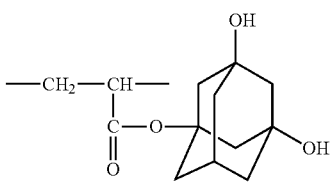
(1)

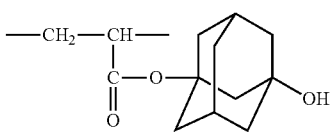
(2)

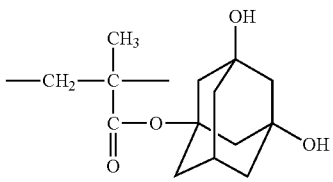
(3)

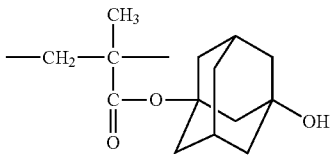
(4)

The alicyclic hydrocarbon-based acid-decomposable resin in the invention may have a repeating unit represented by the following formula (VIII).

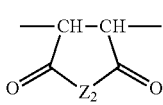
(VIII)

In formula (VIII), $Z_2$ represents —O— or —N($R_{41}$)—; $R_{41}$ represents a hydrogen atom, a hydroxyl group, an alkyl group or —OSO$_2$—$R_{42}$; and $R_{42}$ represents an alkyl group, a cycloalkyl group, or a camphor residue. The alkyl group and the cycloalkyl group represented by $R_{41}$ and $R_{42}$ may be substituted with a halogen atom, etc.

Formulae [I'-1] to [I'-7] as the specific examples of the repeating units represented by formula (VIII) are shown below, but the invention is not limited thereto.

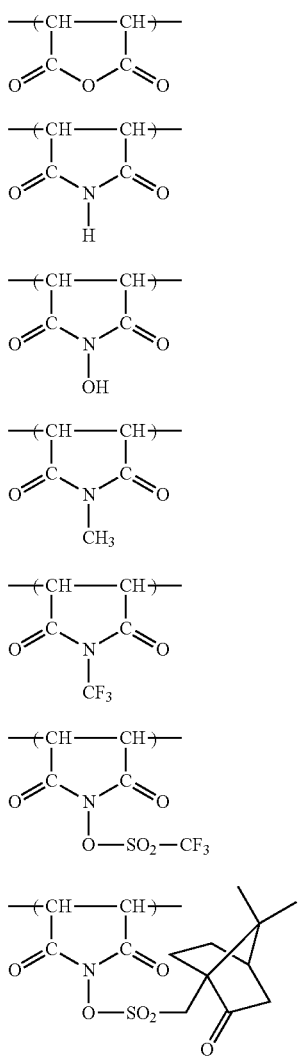

The resin having an acid-decomposable group in the invention is little in the influence of an immersion liquid, so that the variation of the film thickness before and after immersion exposure can be lessened. The variation of the film thickness is preferably from 0 to 10%, more preferably from 0 to 5%.

The alicyclic hydrocarbon-based acid-decomposable resin in the invention may have various repeating structural units besides the above repeating units for the purpose of adjusting dry etching resistance, an aptitude for standard developers, adhesion to substrates, resist profile, and in addition to these, general requisite characteristics of resists, e.g., resolution, heat resistance and sensitivity.

As these repeating structural units, the repeating structural units corresponding to monomers shown below can be exemplified, but the invention is not limited thereto.

By containing various kinds of repeating structural units, fine adjustment of performances required of the alicyclic hydrocarbon-based acid-decomposable resins, in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, the selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the alicyclic hydrocarbon-based acid-decomposable resins, the molar ratio of the content of each repeating structural unit is arbitrarily selected to adjust dry etching resistance, an aptitude for a standard developer, adhesion to a substrate, and resist profile, in addition to the above, to adjust general requisite characteristics of resists, e.g., resolution, heat resistance and sensitivity.

The preferred embodiments of the alicyclic hydrocarbon-based acid-decomposable resins in the invention include the following.

(1) Resins containing a repeating unit having a partial structure containing the alicyclic hydrocarbon represented by any of formulae (pI) to (pVI) (a side chain type).

(2) Resins having a repeating unit represented by formula (II-AB) (a main chain type), and the following embodiment is further exemplified in (2).

(3) Resins having a repeating unit represented by formula (II-AB), a maleic anhydride derivative and a (meth)acrylate structure (a hybrid type).

In the alicyclic hydrocarbon-based acid-decomposable resins, the content of a repeating unit having a partial structure containing alicyclic hydrocarbon represented by any of formulae (pI) to (pVI) is preferably from 20 to 70 mol % in all the repeating structural units, more preferably from 24 to 65 mol %, and still more preferably from 28 to 60 mol %.

In the alicyclic hydrocarbon-based acid-decomposable resins, the content of a repeating unit represented by formula (II-AB) is preferably from 10 to 60 mol % in all the repeating structural units, more preferably from 15 to 55 mol %, and still more preferably from 20 to 50 mol %.

The content of repeating structural units on the basis of the monomers of the further copolymer components in the resin can also be optionally set according to the desired resist performances, and the content is generally preferably 99 mol % or less based on the total mol number of a repeating structural unit having a partial structure containing alicyclic hydrocarbon represented by any of formulae (pI) to (pVI) and a repeating unit represented by formula (II-AB), more preferably 90 mol % or less, and still more preferably 80 mol % or less.

When the photosensitive composition in the invention is a composition for ArF exposure, it is preferred that the resin should not contain an aromatic group from the point of the transparency to ArF light.

When the positive resist composition in the invention is used for immersion exposure, it is preferred for the resin of component (A) to have the following properties (i) and (ii).

(i) the resin comprises a repeating unit having at least one kind of a lactone structure, and
(ii) a portion, which detaches from the resin of component (A) by the action of an acid, has an alicyclic hydrocarbon structure.

As the repeating unit having a lactone structure, e.g., a repeating unit represented by formula (AI) can be exemplified.

As the repeating unit in which a portion, which detaches from the resin of component (A) by the action of an acid, has an alicyclic hydrocarbon structure, e.g., a repeating units represented by formula (pA) in which at least one of $R^{1'}$ to $R^{3'}$ represents a cycloalkyl group, or at least two of $R^{1'}$ to $R^{3'}$ are bonded to form a cycloalkyl group can be exemplified.

The alicyclic hydrocarbon-based acid-decomposable resins for use in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent capable of dissolving the composition of the invention such as cyclic ethers, e.g., tetrahydrofuran or 1,4-dioxane, ketones, e.g., methyl ethyl ketone, methyl isobutyl ketone or cyclohexanone, or the later-described solvents, e.g., propylene glycol monomethyl ether acetate or propylene glycol monomethyl ether, to make the monomer homogeneous. The solution is then heated, if necessary, under the inert gas atmosphere such as nitrogen or argon, and polymerization is initiated with a commercially available radical polymerization initiator (e.g., azo initiators, peroxide and the like). If necessary, the initiator is further added at a time or in parts, and after completion of the reaction, the reaction product is put in a solvent, and a desired polymer is recovered as powder or solid. The reaction concentration is 10 mass % or more, preferably 15 mass % or more, and more preferably 20 mass % or more. (In this specification, mass % is equal to weight %.) The reaction temperature is from 10 to 150° C., preferably from 30 to 130° C., and more preferably from 50 to 110° C.

The repeating structural units in the above specific examples may be used as one kind alone, or a plurality of repeating units may be used as mixture.

Further, acid-decomposable resins may be used as one kind alone, or a plurality of resins may be used in combination.

The weight average molecular weight of acid-decomposable resins in the invention is preferably from 1,000 to 200,000 in polystyrene equivalent by the GPC method, more preferably from 3,000 to 20,000. By bringing the weight average molecular weight to the range of from 1,000 to 200,000, heat resistance, dry etching resistance and developability can be improved, and film-forming property can be improved for extremely high viscosity.

The molecular weight distribution of the acid-decomposable resin in the invention is generally from 1 to 5, preferably from 1 to 4, and more preferably from 1 to 3. By bringing the molecular weight distribution to 5 or lower, resolution can be improved, and deterioration of the resist shape, chapping of the sidewall of the resist pattern, and deterioration of roughness properties can be prevented.

In the positive resist composition of the invention, the compounding amount of all the resins in the entire composition is preferably from 40 to 99.99 mass % in the total solids content of the resist, more preferably from 50 to 99.97 mass %.

[2] (B) Compound Capable of Generating an Acid Upon Irradiation with Actinic Ray or Radiation:

Compounds capable of generating an acid upon irradiation with actinic ray or radiation (hereinafter sometimes referred to as "acid generators") for use in the positive resist composition of the invention are described below.

The acid generators for use in the invention can be selected from among the compounds generally used as acid generators.

That is, as such acid generators, photo-initiators of photo-cationic polymerization, photo-initiators of photo-radical polymerization, photo-decoloring agents of dyes, photo-discoloring agents, or well-known compounds capable of generating an acid upon irradiation with an actinic ray or radiation that are used in the process of micro-resist, and mixtures of these compounds can be used by arbitrary selection.

For example, diazonium salt, phosphonium salt, sulfonium salt, iodonium salt, imidosulfonate, oximesulfonate, diazodisulfone, disulfone, and o-nitrobenzyl sulfonate are exemplified as acid generators.

Further, compounds obtained by introducing a group or a compound capable of generating an acid upon irradiation with an actinic ray or a radiation to the main chain or the side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used as acid generators.

The compounds generating an acid by the action of lights as disclosed in U.S. Pat. No. 3,779,778, EP 126,712 can also be used.

As preferred compounds capable of decomposing and generating an acid upon irradiation with actinic ray or radiation that can be used in combination in the invention, the compounds represented by the following formula (ZI), (ZII) or (ZIII) can be exemplified.

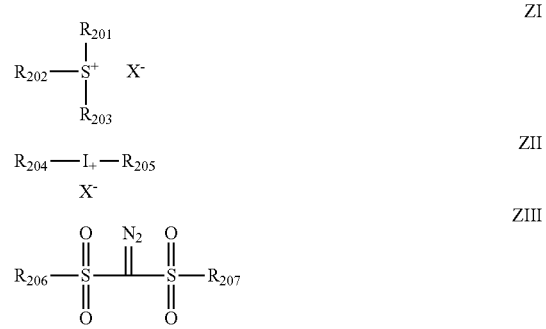

In formula (ZI), $R_{201}$, $R_{202}$ and $R_{203}$ each independently represents an organic group.

$X^-$ represents a non-nucleophilic anion.

The number of carbon atoms of the organic groups represented by $R_{201}$, $R_{202}$ and $R_{203}$ is generally from 1 to 30, preferably from 1 to 20.

Two of $R_{201}$, $R_{202}$ and $R_{203}$ may be bonded to form a cyclic structure, and an oxygen atom, a sulfur atom, an ester bond, an amido bond or a carbonyl group may be contained in the ring.

As the group formed by bonding two of $R_{201}$, $R_{202}$ and $R_{203}$, an alkylene group (e.g., a butylene group, a pentylene group) can be exemplified.

As the specific examples of the organic groups represented by $R_{201}$, $R_{202}$ and $R_{203}$, the corresponding groups in the later-described compounds represented by formula (ZI-1), (ZI-2) or (ZI-3) can be exemplified.

A compound represented by formula (ZI) may be a compound having a plurality of structures represented by formula (ZI). For instance, compound (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

Components (ZI) are more preferably the compounds represented by the following formula (ZI-1), (ZI-2) or (ZI-3).

Compound (ZI-1) is an arylsulfonium compound having arylsulfonium as a cation, that is, a compound represented by formula (ZI) in which at least one of $R_{201}$ to $R_{203}$ represents an aryl group is compound (ZI-1).

All of $R_{201}$ to $R_{203}$ of the arylsulfonium compound may be aryl groups, or a part of $R_{201}$ to $R_{203}$ may represent an aryl group and the remainder may represent an alkyl group or a cycloalkyl group.

As the arylsulfonium compounds, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl groups of the arylsulfonium compound, a phenyl group and a naphthyl group are preferred, and a phenyl group is more preferred. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms and, e.g., a methyl group, an ethyl group, a propyl group, an n-butyl group, a sec-butyl group, and a t-butyl group can be exemplified.

The cycloalkyl group that the arylsulfonium compound has according to necessity is preferably a cycloalkyl group having from 3 to 15 carbon atoms and, e.g., a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent and, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$ to $R_{203}$, or may be substituted on all of three. When $R_{201}$, $R_{202}$ and $R_{203}$ each independently represents an aryl group, it is preferred that the substituent be substituted on the p-position of the aryl group.

As the examples of non-nucleophilic anions represented by $X^-$ in formula (ZI), e.g., a sulfonate anion, a carboxylate anion, a sulfonylimide anion, a bis(alkylsulfonyl)imide anion, and a tris(alkylsulfonyl)methyl anion can be exemplified.

A non-nucleophilic anion is an anion having extremely low ability of causing a nucleophilic reaction and capable of restraining the aging decomposition due to an intramolecular nucleophilic reaction, so that the aging stability of a resist can be improved with a non-nucleophilic anion.

As the sulfonate anions, e.g., an aliphatic sulfonate anion, an aromatic sulfonate anion and a camphor sulfonate anion are exemplified.

As the carboxylate anions, e.g., an aliphatic carboxylate anion, an aromatic carboxylate anion and an aralkylcarboxylate anion are exemplified.

The aliphatic hydrocarbon group in the aliphatic sulfonate anion is preferably an alkyl group having from 1 to 30 carbon atoms and, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, and a cycloalkyl group having from 3 to 30 carbon atoms, e.g., a cyclopropyl group, a cyclopentyl group, a cyclohexyl group, an adamantyl group, a norbonyl group and a boronyl group can be exemplified.

The aryl group in the aromatic sulfonate anion is preferably an aryl group having from 6 to 14 carbon atoms and, e.g., a phenyl group, a tolyl group, and a naphthyl group can be exemplified.

The alkyl group, cycloalkyl group and aryl group in the above aliphatic sulfonate anion and aromatic sulfonate anion may have a substituent.

As the substituents, e.g., a halogen atom, an alkyl group, an alkoxyl group and an alkylthio group can be exemplified.

As the halogen atom, e.g., a chlorine atom, a bromine atom, a fluorine atom, and an iodine atom can be exemplified.

As the alkyl group, preferably an alkyl group having from 1 to 15 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group and an eicosyl group can be exemplified.

As the alkoxyl group, preferably an alkoxyl group having from 1 to 5 carbon atoms, e.g., a methoxy group, an ethoxy group, a propoxy group and a butoxy group can be exemplified.

As the alkylthio group, preferably an alkylthio group having from 1 to 15 carbon atoms, e.g., a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, a undecylthio group, a dodecylthio group, a tridecylthio group, a tetradecylthio group, a pentadecylthio group, a hexadecylthio group, a heptadecylthio group, an octadecylthio group, a nonadecylthio group and an eicosylthio group can be exemplified. Further, the alkyl group, alkoxyl group and alkylthio group may further be substituted with a halogen atom (preferably a fluorine atom).

As the aliphatic hydrocarbon group in the aliphatic carboxylate anion, the same aliphatic hydrocarbon groups as in the aliphatic sulfonate anion can be exemplified.

As the aromatic group in the aromatic carboxylate anion, the same aromatic groups as in the aromatic sulfonate anion can be exemplified.

As the aralkyl group in the aralkylcarboxylate anion, preferably an aralkyl group having from 6 to 12 carbon atoms, e.g., a benzyl group, a phenethyl group, a naphthylmethyl group and a naphthylethyl group can be exemplified.

The alkyl group, cycloalkyl group, aryl group and aralkyl group in the aliphatic carboxylate anion, the aliphatic carboxylate anion and the aralkylcarboxylate anion may have a substituent, and as the substituents, e.g., the same halogen atoms, alkyl groups, cycloalkyl groups, alkoxyl groups and alkylthio groups as in the aliphatic sulfonate anion and the aromatic sulfonate anion can be exemplified.

As the sulfonylimide anion, e.g., a saccharin anion can be exemplified.

The alkyl groups in the bis(alkylsulfonyl)imide anion, and the tris(alkylsulfonyl)methyl anion are preferably alkyl groups having from 1 to 5 carbon atoms, e.g., a methyl group, an ethyl group, a propyl group, an isopropyl group, an n-butyl group, an isobutyl group, a sec-butyl group, a pentyl group and a neopentyl group are exemplified. These alkyl groups may have a substituent and, e.g., a halogen atom, an alkyl group substituted with a halogen atom, an alkoxyl group, and an alkylthio group can be exemplified as the substituents. An alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $X^-$, an aliphatic sulfonate anion substituted with a fluorine atom, an aromatic sulfonate anion substituted with a fluorine atom or a group having a fluorine atom, a bis(alkylsulfonyl)imide anion in which the alkyl group is substituted with a fluorine atom, and a tris(alkylsulfonyl)methide anion in which the alkyl group is substituted with a fluorine atom are preferred. More preferred non-nucleophilic anions represented by $X^-$ are a fluorine-substituted aliphatic sulfonate anion having from 4 to 8 carbon atoms, and especially preferred non-nucleophilic anions are a nonafluorobutanesulfonate anion, and a perfluoro-octanesulfonate anion.

Compound (ZI-2) is described below.

Compound (ZI-2) is a compound in the case where $R_{201}$, $R_{202}$ and $R_{203}$ in formula (ZI) each independently represents an organic group not containing an aromatic ring. The aromatic ring also includes an aromatic ring containing a hetero atom.

The organic groups not containing an aromatic ring represented by $R_{201}$ to $R_{203}$ generally have from 1 to 30 carbon atoms, preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain, branched or cyclic 2-oxoalkyl group, or an alkoxycarbonylmethyl group, and most preferably a straight or branched 2-oxoalkyl group.

The alkyl group represented by $R_{201}$ to $R_{203}$ may be straight chain or branched, preferably a straight chain or branched alkyl group having from 1 to 10 carbon atoms (e.g., a methyl group, an ethyl group, a propyl group, a butyl group, a pentyl group), more preferably a straight chain or branched 2-oxoalkyl group or alkoxycarbonylmethyl group.

The cycloalkyl group represented by $R_{201}$ to $R_{203}$ is preferably a cycloalkyl group having from 3 to 10 carbon atoms (e.g., a cyclopentyl group, a cyclohexyl group, a norbonyl group), more preferably a cyclic 2-oxocycloalkyl group.

As the preferred straight chain, branched or cyclic 2-oxoalkyl group represented by $R_{201}$ to $R_{203}$, the above alkyl group and cycloalkyl group having >C=O at the 2-position can be exemplified.

As the alkoxyl group in the alkoxycarbonylmethyl group represented by $R_{201}$ to $R_{203}$, preferably an alkoxyl group having from 1 to 5 carbon atoms (e.g., a methoxy group, an ethoxy group, a propoxy group, a butoxy group, a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group or a nitro group.

Compound (ZI-3) is a compound represented by the following formula (ZI-3), which compound has a phenacylsulfonium salt structure.

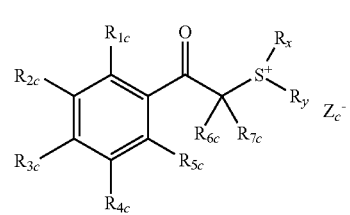

In formula (ZI-3), $R_{1c}$, $R_{2c}$, $R_{3c}$, $R_{4c}$ and $R_{5c}$ each independently represents a hydrogen atom, an alkyl group, a cycloalkyl group, an alkoxyl group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more of $R_{1c}$ to $R_{5c}$, $R_{6c}$ and $R_{7c}$, and $R_x$ and $R_y$ may be bonded to each other to form a cyclic structure, and the cyclic structure may contain an oxygen atom, a sulfur atom, an ester bond or an amide bond. As the groups formed by the bonding of any two or more of $R_{1c}$ to $R_{5c}$, $R_{6c}$ and $R_{7c}$, and $R_x$ and $R_y$, a butylene group and a pentylene group can be exemplified.

$Z_c^-$ represents a non-nucleophilic anion, and the same non-nucleophilic anion represented by $X^-$ in formula (ZI) can be exemplified.

The alkyl groups represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, a straight chain or branched pentyl group) can be exemplified.

As the cycloalkyl groups represented by $R_{1c}$ to $R_{7c}$, a cycloalkyl group having from 3 to 8 carbon atoms (e.g., a cyclopentyl group and a cyclohexyl group) can be exemplified.

The alkoxyl groups represented by $R_{1c}$ to $R_{7c}$ may be straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group and a cyclohexyloxy group) can be exemplified.

It is preferred that any of $R_{1c}$ to $R_{5c}$ represents a straight chain or branched alkyl group, a cycloalkyl group, or a straight chain, branched or cyclic alkoxyl group, it is more preferred that the sum total of the carbon atoms of $R_{1c}$ to $R_{5c}$ is from 2 to 15, by which the solubility in a solvent increases and generation of particles during preservation can be restrained.

As the alkyls group represented by $R_x$ and $R_y$, the same alkyl groups represented by $R_{1c}$ to $R_{7c}$ can be exemplified. The alkyl groups represented by $R_x$ and $R_y$ are more preferably a straight chain or branched 2-oxoalkyl group and an alkoxy-carbonylmethyl group. As the straight chain or branched 2-oxoalkyl group, the groups having >C=O on the 2-position of the alkyl groups represented by $R_{1c}$ to $R_{7c}$ can be exemplified. As the alkoxyl group of the alkoxycarbonylmethyl group, the same alkoxyl groups as those represented by $R_{1c}$ and $R_{5c}$ can be exemplified.

As the cycloalkyl groups represented by $R_x$ and $R_y$, the same cycloalkyl groups as represented by $R_{1c}$ to $R_{7c}$ can be exemplified. The cycloalkyl groups represented by $R_x$ and $R_y$ are more preferably cyclic 2-oxoalkyl groups. As the cyclic 2-oxoalkyl groups, the groups having >C=O on the 2-position of the cycloalkyl groups represented by $R_{1c}$ to $R_{7c}$ can be exemplified.

$R_x$ and $R_y$ each preferably represents an alkyl group or a cycloalkyl group having 4 or more carbon atoms, more preferably having 6 or more carbon atoms, and still more preferably an alkyl group or a cycloalkyl group having 8 or more carbon atoms.

In formulae (ZII) and (ZIII), $R_{204}$, $R_{205}$, $R_{206}$ and $R_{207}$ each independently represents an aryl group, an alkyl group or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be straight chain or branched, preferably a straight chain or branched alkyl group having from 1 to 10 carbon atoms (e.g., a methyl group, an ethyl group, a propyl group, a butyl group, a pentyl group).

The cycloalkyl group represented by $R_{204}$ to $R_{207}$ is preferably a cycloalkyl group having from 3 to 10 carbon atoms (e.g., a cyclopentyl group, a cyclohexyl group, a norbornyl group).

The aryl group, alkyl group or cycloalkyl group represented by $R_{204}$ to $R_{207}$ may have a substituent. As the substituents that the aryl group, alkyl group or cycloalkyl group represented by $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

$X^-$ represents a non-nucleophilic anion, and the same non-nucleophilic anions as those represented by $X^-$ in formula (ZI) can be exemplified.

As the compounds capable of decomposing and generating an acid upon irradiation with actinic ray or radiation that can be used in combination, the compounds represented by the following formula (ZIV), (ZV) or (ZVI) can further be exemplified.

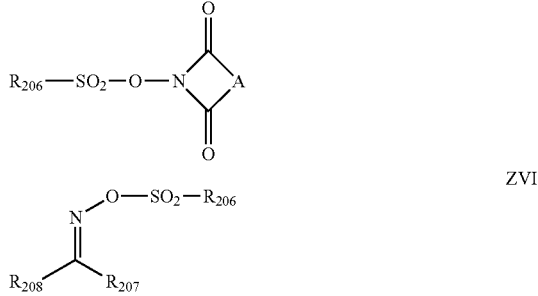

In formulae (ZIV), (ZV) and (ZVI), $Ar_3$ and $Ar_4$ each independently represents an aryl group.

$R_{206}$, $R_{207}$ and $R_{208}$ each independently represents an alkyl group, a cycloalkyl group or an aryl group.

A represents an alkylene group, an alkenylene group or an arylene group.

The compounds capable of decomposing and generating an acid upon irradiation with actinic ray or radiation that can be used are more preferably represented by formula (ZI), (ZII) or (ZIII).

The examples of the compounds capable of decomposing and generating an acid upon irradiation with actinic ray or radiation that can be especially preferably used are shown below.

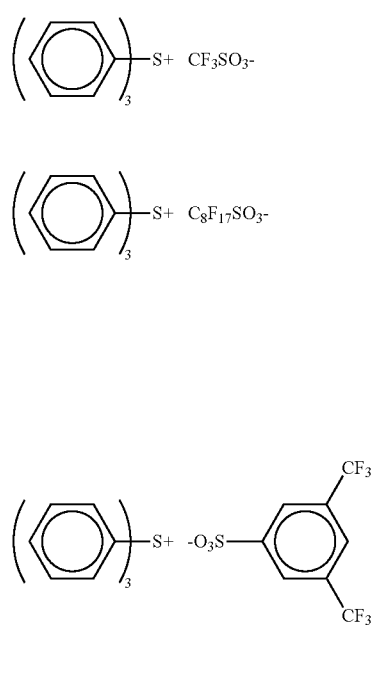

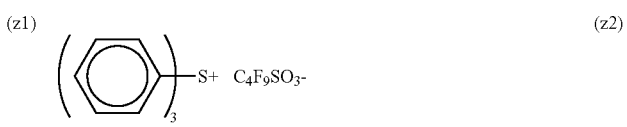

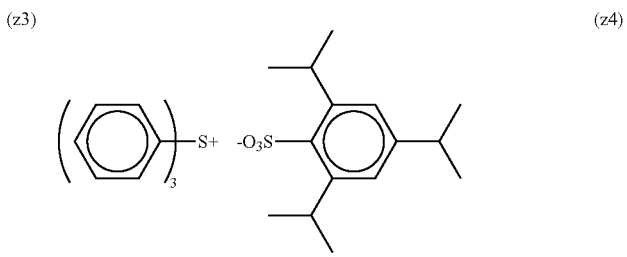

-continued
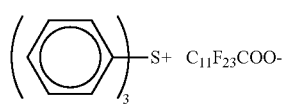 (z7)
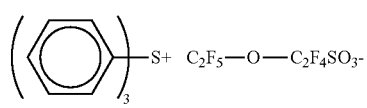 (z8)
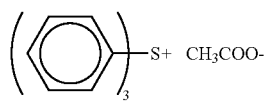 (z9)
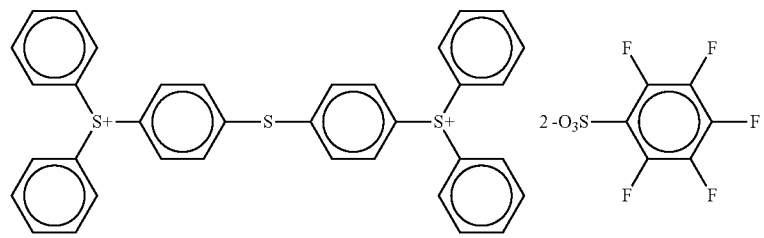 (z10)
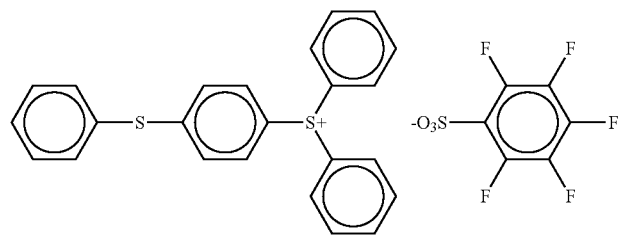 (z11)
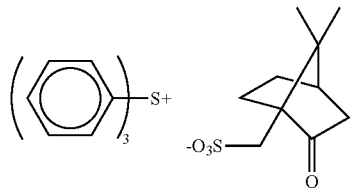 (z12)
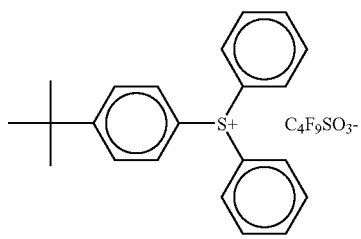 (z13)
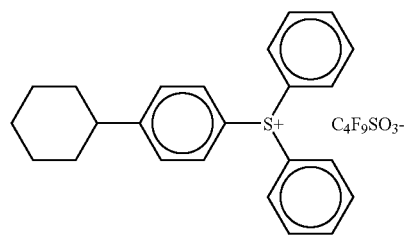 (z14)
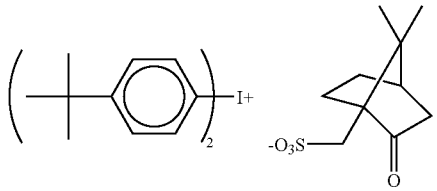 (z15)
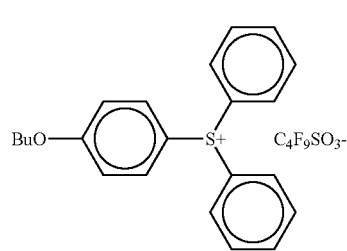 (z16)
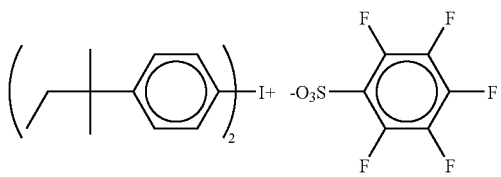 (Z17)
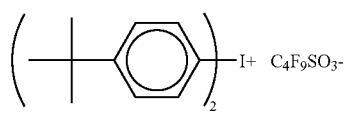 (z18)
(z19)

-continued
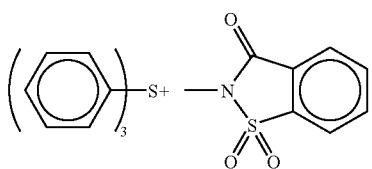 (z20)
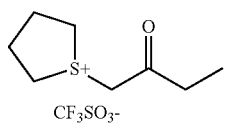 (z21)
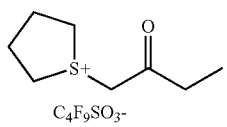 (z22)
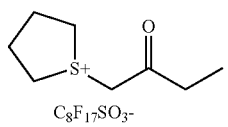 (z23)
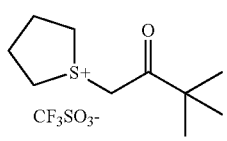 (z24)
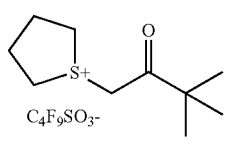 (z25)
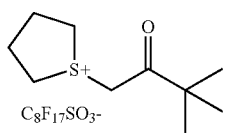 (z26)
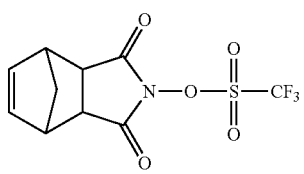 (z27)
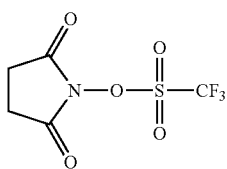 (z28)
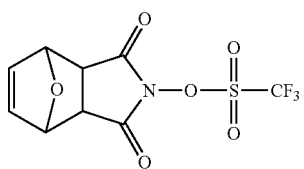 (z29)
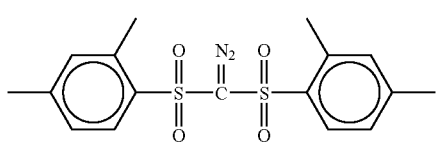 (z30)
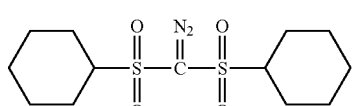 (z31)
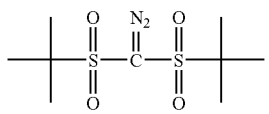 (z32)
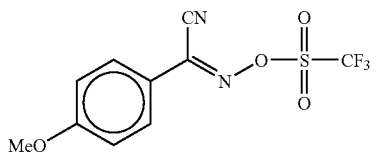 (z33)
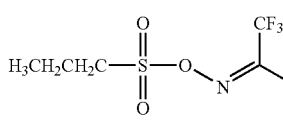 (z34)
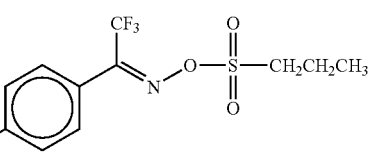 (z35)
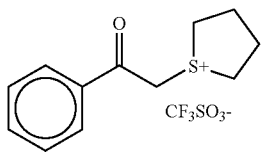 (z36)

-continued
(z37)
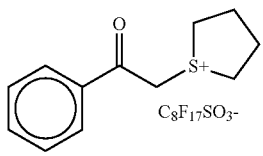
(z38)
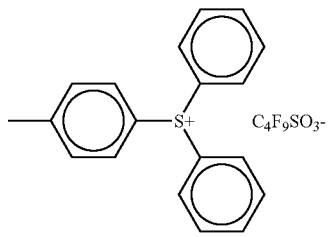
(z39)
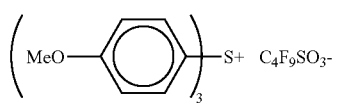
(z40)
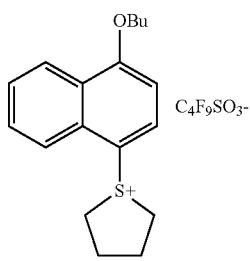
(z41)
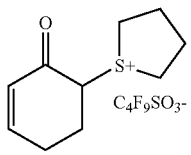
(z42)
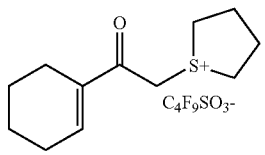
(z43)
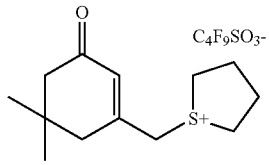
(z44)
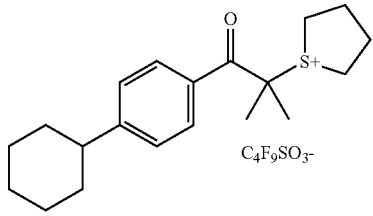
(z45)
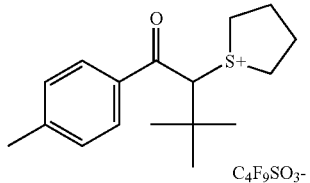
(z46)
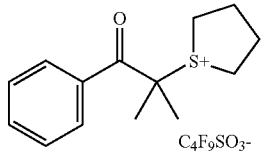
(z47)
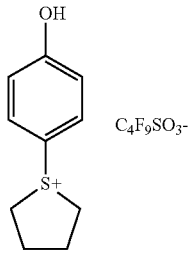
(z48)
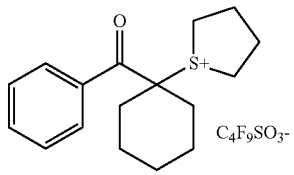
(z49)
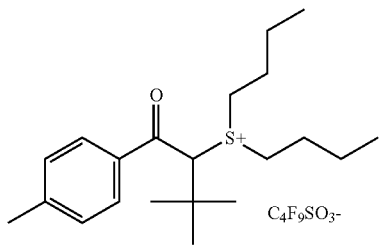
(z50)
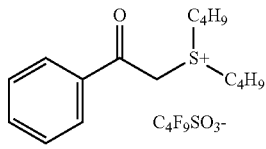

-continued

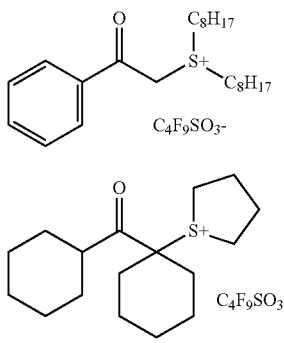
(z51)

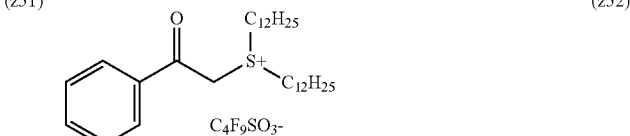
(z52)

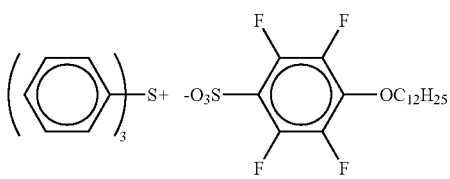
(z53)

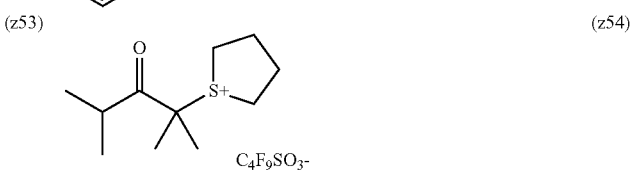
(z54)

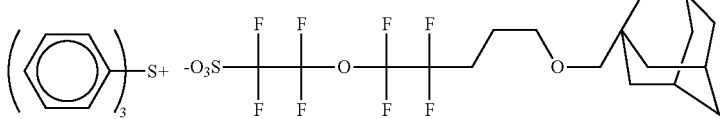
(z55)

(z56)

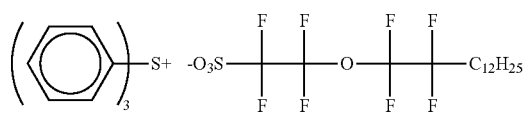
(z57)

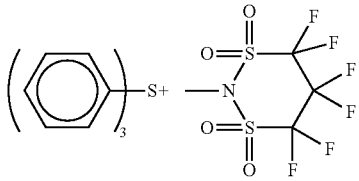
(z58)

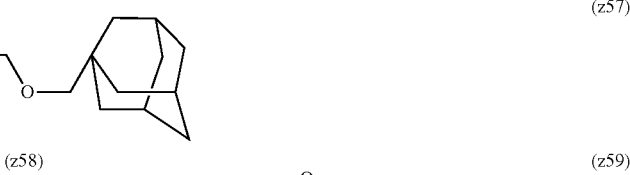
(z59)

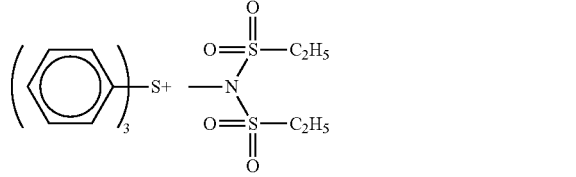

The compounds of component (B) can be used alone, or two or more compounds may be used in combination.

The content of the compounds of component (B) in the positive resist composition in the invention is preferably from 0.1 to 20 mass % on the basis of the solids content in the composition, more preferably from 0.5 to 10 mass %, and still more preferably from 1 to 7 mass %.

[3] (C) Organic Solvent:

The positive resist composition in the invention can be prepared by dissolving each component in a solvent and filtering.

As the organic solvents of component (C), it is preferred to use propylene glycol monomethyl ether acetate (PGMEA) and propylene glycol monomethyl ether (PGME), and the mixing ratio of these solvents is preferably PGMEA/PGME of from 40/60 to 90/10, more preferably PGMEA/PGME of from 45/55 to 85/15, and still more preferably from 50/50 to 80/20. By making the proportion of PGMEA/PGME from 40/60 to 90/10, profile and DOF can be improved.

As organic solvents, in addition to PGMEA and PGME, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethyl-formamide, dimethyl sulfoxide, N-methylpyrrolidone, methoxybutanol and tetrahydrofuran can be used in combination.

[4] (D) Dissolution-Inhibiting Compound:

The positive resist composition in the invention may further contain a dissolution-inhibiting compound having a molecular weight of 3,000 or less capable of decomposing by the action of an acid to increase the solubility in an alkaline developer (sometimes referred to as merely "a dissolution inhibiting compound").

As the dissolution-inhibiting compound having a molecular weight of 3,000 or less capable of decomposing by the action of an acid to increase the solubility in an alkaline developer, alicyclic or aliphatic compounds having acid-decomposable groups, such as cholic acid derivatives containing acid-decomposable groups described in Processing of SPIE, 2724, 355 (1996) are preferred so as not to reduce the permeability of lights of 220 nm or less. As the acid-decomposable groups and alicyclic structures, the same as those described above in the alicyclic hydrocarbon-based acid-decomposable resin are exemplified.

The molecular weight of the dissolution-inhibiting compound in the invention is 3,000 or less, preferably from 300 to 3,000, and more preferably from 500 to 2,500.

The addition amount of the dissolution-inhibiting compound in the invention is preferably from 1 to 30 mass % on the basis of the solids content in the positive resist composition, more preferably from 2 to 20 mass %.

The specific examples of the dissolution-inhibiting compounds are shown below, but the invention is not limited thereto.

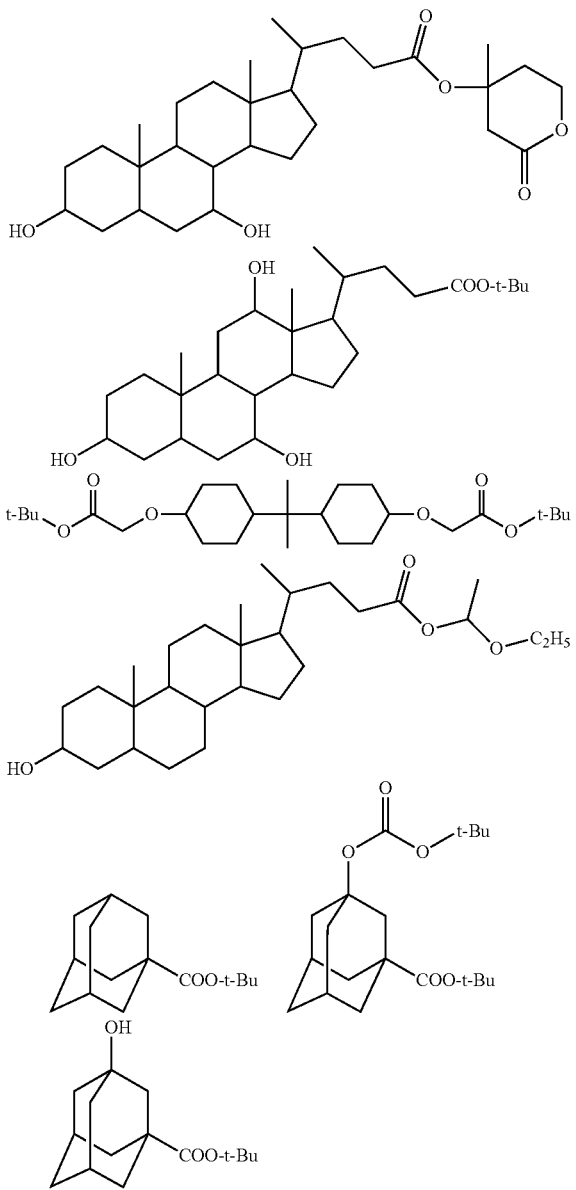

[5] (E) Basic Compound:

It is preferred that the positive resist composition in the invention further contains a basic compound. As the basic compounds, e.g., organic amine, basic ammonium salt, basic sulfonium salt and basic iodonium salt are used. The basic compounds will do so long as they do not reduce sublimation and resist performances. The basic compound is a component to control the diffusion of the acid generated from an acid generator by exposure in the resist film and having a function of suppressing undesired chemical reaction in the non-exposed area. By compounding such a basic compound, the diffusion of the acid generated from an acid generator by exposure in the resist film can be controlled, the storage stability of a resist composition for immersion exposure to be obtained can be improved, the resolution of the resist is further improved, the line width variation due to the fluctuation of post exposure time delay (PED) from exposure to development process can be prevented, so that a composition extremely excellent in process stability can be obtained.

As the basic compounds, organic amines can be used and, e.g., primary, secondary and tertiary aliphatic amines, aromatic amines, heterocyclic amines, nitrogen-containing compounds having a carboxyl group, nitrogen-containing compounds having a sulfonyl group, nitrogen-containing compounds having a hydroxyl group, amide derivatives, imide derivatives, and basic compounds having a cyano group can be exemplified.

As the aliphatic amines, e.g., methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropyl-amine, di-n-butylamine, diisobutylamine, di-sec-butylamine, dipentylamine, dicyclopentylamine, dihexylamine, dicycl-ohexylamine, diheptylamine, dioctylamine, dinonylamine, didecylamine, didodecylamine, dicetylamine, N,N-dimethyl-methylenediamine, N,N-dimethylethylenediamine, N,N-dimethyltetraethylenepentamine, trimethylamine, triethyl-amine, tri-n-propylamine, triisopropylamine, tri-n-butyl-amine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, tris-2-[2-methoxy(ethoxy)]-ethylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine, and benzyl-dimethylamine are exemplified.

As the aromatic amines and the heterocyclic amines, e.g., aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitro-aniline, 4-nitroaniline, 2,4-dinitroaniline, 2,6-dinitro-aniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isooxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methyl-pyrrolidone, etc.), imidazoline derivatives, imidazolidine derivatives, pyridine derivatives (e.g., pyridine, methyl-pyridine, ethylpyridine, propylpyridine, butylpyridine, 4-(1-butylpentyl)pyridine, dimethylpyridine, trimethyl-pyridine, triethylpyridine, phenylpyridine, 3-methyl-2-phenylpyridine, 4-tert-butylpyridine, diphenylpyridine, benzylpyridine, methoxypyridine, butoxypyridine, dimethoxy-pyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives can be exemplified.

As the nitrogen-containing compounds having a carboxyl group, e.g., aminobenzoic acid, indolecarboxylic acid, amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxy-alanine), etc., can be exemplified.

As the nitrogen-containing compounds having a sulfonyl group, e.g., 3-pyridinesulfonic acid, pyridinium p-toluenesulfonate, etc., can be exemplified.

As the nitrogen-containing compounds having a hydroxyl group, e.g., 2-hydroxypyridine, aminocresol, 2,4-quinolinediol, 3-indolemethanol hydrate, monoethanolamine, diethanol-amine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxy-julolidine, 3-quinuclidinol, 3-tropanol, 1-methyl-2-pyrrolidinethanol, 1-aziridinethanol, N-(2-hydroxyethyl)-phthalimide, N-(2-hydroxyethyl)isonicotinamide, etc., can be exemplified.

As the amide derivatives, e.g., formamide, N-methylformamide, N,N-dimethylformamide, acetamide, N-methylacetamide, N,N-dimethylacetamide, propionamide, benzamide, etc., can be exemplified.

As the imide derivatives, e.g., phthalimide, succinimide, maleimide, etc., can be exemplified.

As the basic compounds having a cyano group, specifically, e.g., 3-(diethylamino)propionitrile, N,N-bis(2-hydroxy-ethyl)-3-aminopropiononitrile, N,N-bis(2-acetoxy-ethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-amino-propiononitrile, methyl N-(2-cyanoethyl)-N-(2-methoxy-ethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-amino-propiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyano ethyl)-N-tetra-hydrofurfuryl-3-aminopropiononitrile, N,N-bis(2-cyano-ethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoaceto-nitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidine-propiononitrile, 1-piperidinepropiononitrile, 4-morpholine-propiononitrile, 1-pyrrolidineacetonitrile, 1-piperidine-acetonitrile, 4-morpholineacetonitrile, cyanomethyl 3-diethylaminopropionate, cyanomethyl N,N-bis(2-hydroxy-ethyl)-3-aminopropionate, cyanomethyl N,N-bis(2-acetoxy-ethyl)-3-aminopropionate, cyanomethyl N,N-bis(2-formyloxy-ethyl)-3-aminopropionate, cyanomethyl N,N-bis(2-methoxy-ethyl)-3-aminopropionate, cyanomethyl N,N-bis[2-(methoxy-methoxy)ethyl]-3-aminopropionate, (2-cyanoethyl) 3-diethyl-aminopropionate, (2-cyanoethyl) N,N-bis(2-hydroxyethyl)-3-aminopropionate, (2-cyanoethyl) N,N-bis(2-acetoxyethyl)-3-aminopropionate, (2-cyanoethyl) N,N-bis(2-formyloxyethyl)-3-aminopropionate, (2-cyanoethyl) N,N-bis(2-methoxyethyl)-3-aminopropionate, (2-cyanoethyl) N,N-bis[2-(methoxy-methoxy)ethyl]-3-aminopropionate, cyanomethyl 1-pyrrolidinepropionate, cyanomethyl 1-piperidinepropionate, cyanomethyl 4-morpholinepropionate, (2-cyanoethyl) 1-pyrrolidinepropionate, (2-cyanoethyl) 1-piperidine-propionate, and (2-cyanoethyl) 4-morpholinepropionate can be exemplified.

As the basic compounds, e.g., 1,5-diazabicyclo-[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, hexamethylenetetramine, imidazoles, hydroxypyridines, pyridines, anilines, hydroxyalkylanilines, 4,4'-diaminodiphenyl ether, pyridinium p-toluenesulfonate, 2,4,6-trimethylpyridinium p-toluene-sulfonate, tetramethylammonium p-toluenesulfonate, tetrabutylammonium lactate, triethylamine, tri-n-propylamine, tri-n-butylamine, tri-n-pentylamine, tri-n-hexylamine, tri-n-heptylamine, tri-n-octylamine, tri-i-octylamine, tris(ethylhexyl)amine, tri-n-decylamine, tridodecylamine, tri-n-nonylamine, tris-2-[2-methoxy(ethoxy)]ethylamine, cyclohexyldimethylamine, methyldicyclohexylamine, ethylene-diamine, N,N,N',N'-tetramethylethylenediamine, tetra-methylenediamine, hexamethylenediamine, 4,4'-diamino-diphenylmethane, 4,4'-diaminodiphenyl ether, 4,4'-diamino-benzophenone, 4,4'-diaminodiphenylamine, 2,2-bis(4-amino-phenyl)propane, 2-(3-aminophenyl)-2-(4-aminophenyl)propane, 244-aminophenyl)-2-(3-hydroxyphenyl)propane, 2-(4-amino-phenyl)-2-(4-hydroxyphenyl)propane, 1,4-bis[1-(4-amino-phenyl)-1-methylethyl]benzene, 1,3-bis[1-(4-aminophenyl)-1-methylethyl]benzene, bis(2-dimethylaminoethyl) ether, bis(2-diethylaminoethyl)ether, N,N,N',N'-tetrakis(2-hydroxypropyl)ethylenediamine, tri(cyclo)alkylamines, e.g., tricyclohexylamine; aromatic amines, e.g., aniline, N-methylaniline, N,N-dimethylaniline, 2-methylaniline, 3-methylaniline, 4-methylaniline, 4-nitroaniline, diphenyl-amine, triphenylamine, naphthylamine, 2,6-diisopropylaniline, etc.; polyethyleneimine, polyallylamine, polymer of 2-dimethylaminoethylacrylamide N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxy-carbonyl-1-adamantylamine, N,N-di-t-butoxycarbonyl-N-methyl-1-adamantylamine, N-t- butoxycarbonyl-4,4'-diamino-diphenylmethane, N,N'-di-t-butoxycarbonylhexamethylene-diamine, N,N,N',N'-tetra-t-butoxycarbonylhexamethylene-diamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazoles, e.g., imidazole, 4-methyl-imidazole, 4-methyl-2-phenylimidazole, benzimidazole, 2-phenylbenzimidazole, etc.; pyridines, e.g., pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amine, quinoline, 4-hydroxyquinoline, 8-oxyquinoline, acridine, etc.; piperazines, e.g., piperazine, 1-(2-hydroxyethyl) piperazine, etc.; pyrazine, pyrazole, pyridazine, quinozaline, purine, pyrrolidine, piperidine, 3-piperidino-1,2-propanediol, morpholine, 4-methyl-morpholine, and 1,4-dimethylpiperazine are preferred exemplified.

Of these organic amines, e.g., 1,5-diazabicyclo[4.3.0]-5-nonene, 1,8-diazabicyclo[5.4.0]-7-undecene, 1,4-diazabi-cyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, 4,4'-diaminodiphenyl ether, triethylamine, tri-n-butylamine, tri-n-pentylamine, tri-n-octylamine, tris(ethylhexyl)amine, tridodecylamine, tris-2-[2-methoxy(ethoxy)]ethylamine, N,N-dihydroxyethylaniline and N-hydroxyethyl-N-ethylaniline are especially preferred.

Basic compounds can be used alone or two or more in combination, and it is more preferred to use two or more.

It is further preferred for the positive resist composition in the invention to contain ammonium salt compounds. As the specific examples of the ammonium salt compounds, the compounds shown below can be exemplified, but the invention is not limited thereto.

Specifically, ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxyl, ammonium tridecylcarboxylate, ammonium tetradecylcarboxylate, ammonium pentadecylcarboxylate, ammonium hexadecyl-carboxylate, ammonium heptadecyl-carboxylate, and ammonium octadecylcarboxylate can be exemplified.

As the ammonium hydroxide, specifically tetramethyl-ammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethyl-ammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethyl-ammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)-trimethylammonium hydroxide, (3-bromopropyl)triethyl-ammonium hydroxide, glycidyltrimethylammonium hydroxide, choline hydroxide, (R)-(+)-(3-chloro-2-hydroxypropyl)-trimethylammonium hydroxide, (S)-(−)-(3-chloro-2-hydroxy-propyl)trimethylammonium hydroxide, (3-chloro-2-hydroxy-propyl)trimethylammonium hydroxide, (2-aminoethyl)-trimethylammonium hydroxide, hexamethonium hydroxide, decamethonium hydroxide, 1-azoniaproperan hydroxide, petronium hydroxide, 2-chloro-1,3-dimethyl-2-imidazolinium hydroxide, and 3-ethyl-2-methyl-2-thiazolinium hydroxide can be exemplified.

The addition amount of organic amines and basic ammonium salts is generally from 0.001 to 10 mass % as the total amount on the basis of the solids content of the positive resist composition, preferably from 0.01 to 5 mass %. In the range of the addition amount of from 0.001 to 10 mass %, sufficient addition effect can be obtained and the tendency of lowering of sensitivity and deterioration of the developability of a non-exposed area.

[6] (F) Surfactant Containing from 30 to 60 Mass % of Fluorine Atoms:

The positive resist composition in the invention contains a surfactant containing from 30 to 60 mass % of fluorine atoms (referred to as also "surfactant of component (F)" or "surfactant (F)").

As commercially available products of the surfactants of component (F), e.g., PF636, PF656, PF6320 and PF6520 (products of OMNIVA), FTX-204D, 208G, 218G, 230G, 204D, 208D, 212D, 218, 222D, 720C and 740C (products of Neos) can be exemplified.

The surfactants of component (F) can also be synthesized by radical polymerization and ring opening polymerization. As the surfactants of component (F) synthesized by radical polymerization, e.g., (meth)acrylate derivatives, polyvinyl alcohol derivatives, hexafluoropropene derivatives, ethyleneoxy-containing oligomers, silane coupling derivatives, and sugar derivatives are exemplified.

The specific examples of preferred surfactants of component (F) are shown below, but the invention is not limited thereto.

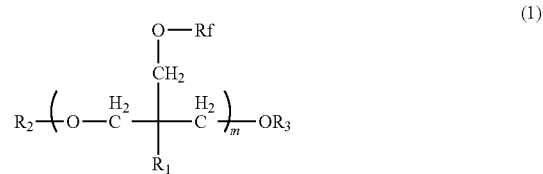

(1)

In formula (1), $R_1$ represents a hydrogen atom or an alkyl group; $R_2$ and $R_3$ each independently represents a hydrogen atom, an alkyl group, an alkylcarbonyl group or a lactone group; Rf represents a fluoroalkyl group or a fluoroalkylcarbonyl group; and m represents an integer of from 1 to 50.

As the fluoroalkyl group represented by Rf in formula (1), e.g., $-CF_3$, $-C_2F_5$, $-C_4F_9$, $-CH_2CF_3$, $-CH_2C_2F_5$, —CH$_2$C$_3$F$_7$, —CH$_2$C$_4$F$_9$, —CH$_2$C$_6$F$_{13}$, —C$_2$H$_4$CF$_3$, —C$_2$H$_4$C$_2$F$_5$, —C$_2$H$_4$C$_4$F$_9$, —C$_2$H$_4$C$_6$F$_{13}$, —C$_2$H$_4$C$_8$F$_{17}$, —CH$_2$CH(CH$_3$)CF$_3$, —CH$_2$CH(CF$_3$)$_2$, —CH$_2$CF(CF$_3$)$_2$, —CH$_2$CH(CF$_3$)$_2$, —CF$_2$CF(CF$_3$)OCF$_3$, —CF$_2$CF(CF$_3$)OC$_3$F$_7$, —C$_2$H$_4$OCF$_2$CF(CF$_3$)OCF$_3$, —C$_2$H$_4$OCF$_2$CF(CF$_3$)OC$_3$F$_7$ and —C(CF$_3$)=C[CF(CF$_3$)$_2$]$_2$ can be exemplified.

As the fluoroalkylcarbonyl group represented by Rf in formula (1), e.g., —COCF$_3$, —COC$_2$F$_5$, —COC$_3$F$_7$, —COC$_4$F$_9$, —COC$_6$F$_{13}$ and —COC$_8$F$_{17}$ can be exemplified.

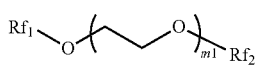
(2)

In formula (2), Rf$_1$ and Rf$_2$ each independently represents a fluoroalkyl group, which is the same as the fluoroalkyl group represented by Rf in formula (1); and m1 represents an integer of from 2 to 50.

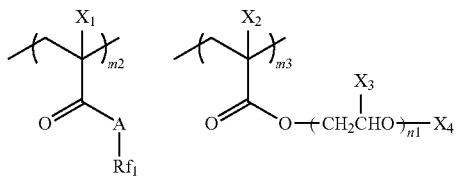
(3)

In formula (3), X$_1$, X$_2$, X$_3$ and X$_4$ each independently represents a hydrogen atom, an alkyl group or a fluoroalkyl group; A represents an oxygen atom, a sulfur atom, or —NR—; R represents a hydrogen atom or an alkyl group; Rf$_1$ represents a fluoroalkyl group; m2 and m3 each independently represents an integer of from 0 to 60; and n1 represents an integer of from 0 to 20.

The alkyl groups represented by X$_1$, X$_2$, X$_3$ and X$_4$ are preferably alkyl groups having from 1 to 5 carbon atoms, e.g., a methyl group, an ethyl group, a propyl group, an i-propyl group, a butyl group, an i-butyl group and a t-butyl group can be exemplified.

As the fluoroalkyl groups represented by X$_1$, X$_2$, X$_3$, X$_4$ and Rf$_1$, the same groups as the fluoroalkyl groups represented by Rf in formula (1) can be exemplified.

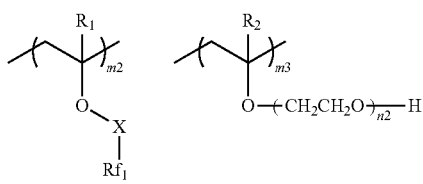
(4)

In formula (4), R$_1$ and R$_2$ each independently represents a hydrogen atom, a methyl group or a trifluoromethyl group; Rf$_1$ represents a fluoroalkyl group, which is the same as the fluoroalkyl group represented by Rf in formula (1); X represents a single bond, an alkylene group, an ether group or an oxyalkylene group; m2 and m3 each independently represents an integer of from 0 to 60; and n2 represents an integer of from 0 to 20.

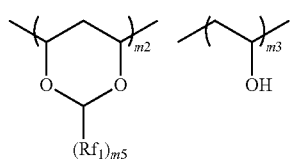
(5)

In formula (5), Rf$_1$ represents a fluoroalkyl group, which is the same as the fluoroalkyl group represented by Rf in formula (1); m2 represents an integer of from 1 to 50; m3 represents an integer of from 0 to 50; and m5 represents an integer of 1 or 2.

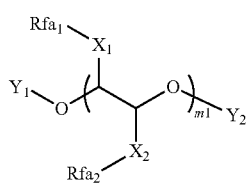
(6)

In formula (6), Rfa$_1$ and Rfa$_2$ each independently represents a hydrogen atom or a fluoroalkyl group. As the fluoroalkyl group represented by Rfa$_1$ and Rfa$_2$, the same groups as the fluoroalkyl groups represented by Rf in formula (1) can be exemplified; X$_1$ and X$_2$ each independently represents a single bond, an alkylene group, an ether group or an oxyalkylene group; Y$_1$ and Y$_2$ each independently represents a hydrogen atom, an alkyl group, an alkylcarbonyl group, or a lactone group; and m1 represents an integer of from 2 to 50.

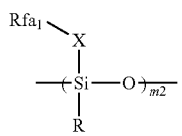
(7)

In formula (7), Rfa$_1$ represents a hydrogen atom or a fluoroalkyl group. As the fluoroalkyl group represented by Rfa$_1$, the same groups as the fluoroalkyl groups represented by Rf in formula (1) can be exemplified; X represents a single bond, an alkylene group, an ether group or an oxyalkylene group; R represents an alkyl group; and m2 represents an integer of from 1 to 50.

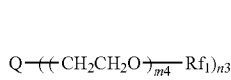
(8)

In formula (8), Q represents a n$^3$-valent linking group (alkylene, ether, cycloalkylene, an aromatic residue, a nitrogen atom); Rf$_1$ represents a fluoroalkyl group, which is the same as the fluoroalkyl group represented by Rf in formula (1); m4 represents an integer of from 0 to 20; and n3 represents an integer of from 2 to 6.

Of the surfactants represented by the above formulae (1) to (8), the surfactants represented by formula (1), (6) or (7) are more preferred, and the surfactant represented by formula (1) is still more preferred.

The specific examples of the surfactants represented by formulae (1) to (8) are shown below, but the invention is not limited thereto.

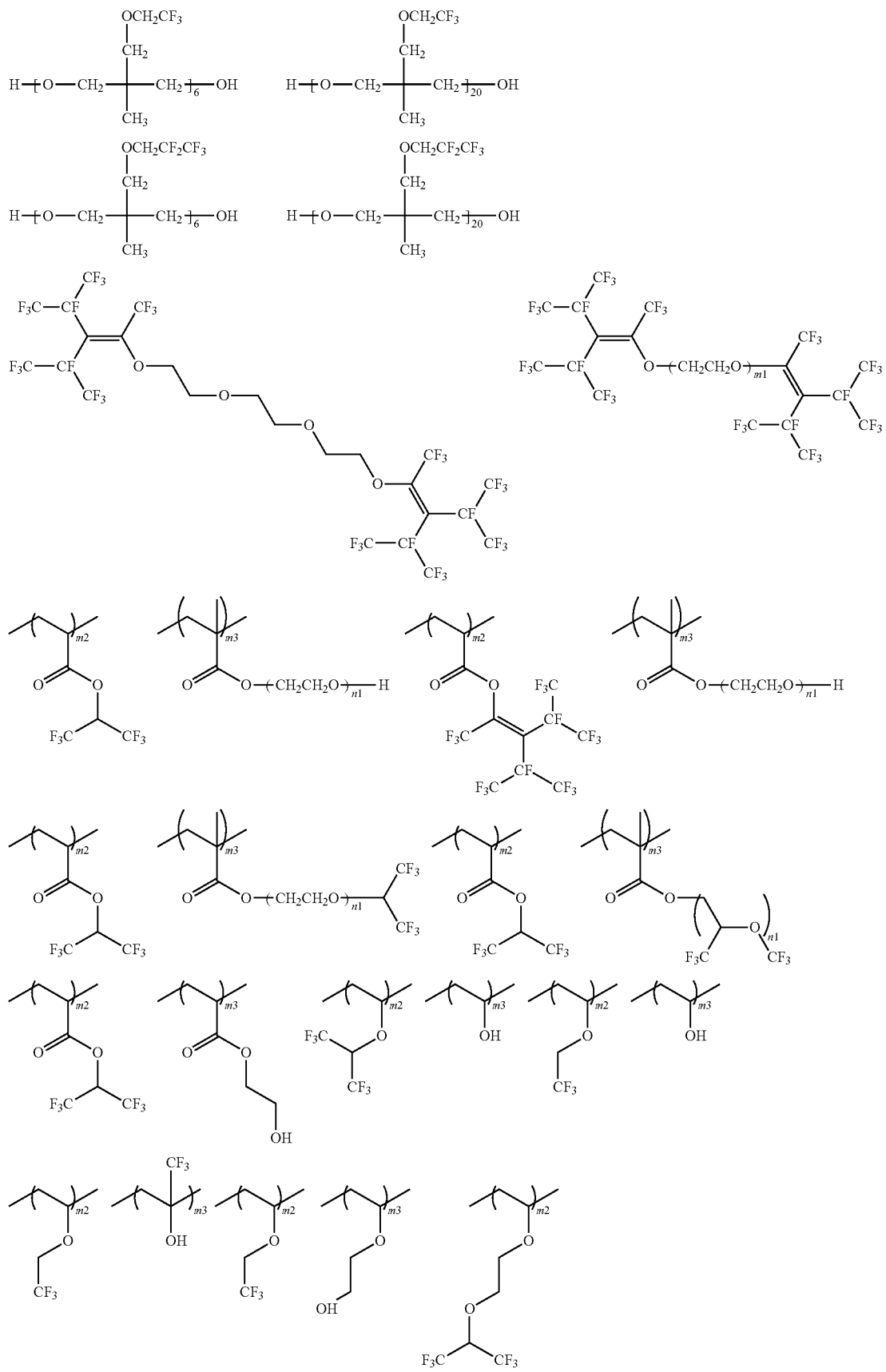

-continued

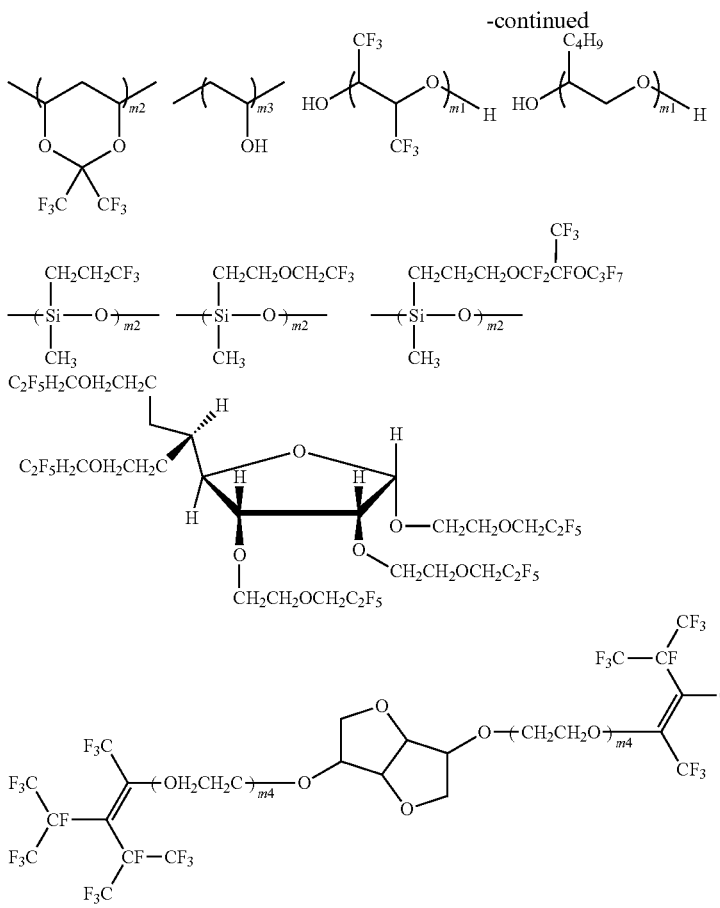

By containing surfactant (F), it becomes possible that the positive resist composition in the invention provides a resist pattern with good sensitivity, resolution, adhesion, and little in development defects at the time of using a light source of 250 nm or less, in particular 220 nm or less, moreover, the deterioration of DOF and profile can be prevented when applied to immersion exposure.

The content of fluorine atoms in surfactant (F) is from 30 to 60 mass %, preferably from 30 to 55 mass %, and more preferably from 35 to 55 mass %.

The use amount of surfactant (F) is preferably from 0.00001 to 0.5 mass % to the total content of the positive resist composition (exclusive of solvents), more preferably from 0.0001 to 0.1 mass %.

When the positive resist composition is used in immersion exposure, the use amount of surfactant (F) is preferably from 0.00001 to 10 mass % to the total content of the positive resist composition (exclusive of solvents), preferably from 0.01 to 5 mass % more preferably from 0.03 to 1 mass %.

Other surfactants can be used in combination with surfactant (F) in the invention.

The proportion of the use amount of surfactant (F) and other surfactant is preferably surfactant (F)/other surfactant in mass ratio of from 60/40 to 99/1, more preferably from 70/30 to 99/1.

As other surfactants that can be used in combination with surfactant (F), the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451 can be exemplified. As commercially available surfactants, Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F113, F110, F177, F120 and R08 (manufactured by Dainippon Ink and Chemicals Inc.), Sarfron S-382, SC101, 102, 103, 104, 105 and 106 (manufactured by ASAHI GLASS CO., LTD.), Troy Sol S-366 (manufactured by Troy Chemical Co., Ltd.), GF-300 and GF-150 (manufactured by TOAGOSEI CO., LTD.), Sarfron S-393 (manufactured by Seimi Chemical Co., Ltd.), and Eftop EF121, EF122A, EF122B, RF122C, EF125M, EF135M, EF351, 352, EF801, EF802 and EF601 (manufactured by Jemco Inc.) are exemplified. In addition, polysiloxane polymer KP-341 (manufactured by Shin-Etsu Chemical Co., Ltd.) can also be used.

As surfactants, in addition to the above-shown well known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized according to the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene) acrylate (or methacrylate) may be not only bipolymers but also terpolymers or higher polymers obtained by copolymerization of monomers having different two or more kinds of fluoro-aliphatic groups and different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyalkylene)) acrylate (or methacrylate), and copolymers of acrylate (or methacrylate) having a $C_8F_{17}$ group, (poly(oxy-ethylene)) acrylate (or methacrylate), and poly(oxypropylene)acrylate (or methacrylate) are exemplified.

Surfactants other than fluorine and/or silicon surfactants can also be used in the invention. Specifically, nonionic surfactants, such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylallyl ether, e.g., polyoxyethylene octylphenol ether and polyoxyethylene nonylphenol ether, polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, and sorbitan tristearate, and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate can be exemplified.

[7] (G) Alkali-Soluble Resin:

The positive resist composition in the invention can further contain water-insoluble and alkali-soluble resin not containing an acid-decomposable group as component (G), by which sensitivity is improved.

Novolak resins having a molecular weight of from 1,000 to 20,000 or so, and polyhydroxystyrene derivatives having a molecular weight of from 3,000 to 50,000 or so can be used as the alkali-soluble resins. Since these resins are great in absorption of rays of 250 nm or less, it is preferred to use them by partially hydrogenating or the amount of 30 mass % or less of the entire resin amount.

It is also possible to use a resin containing a carboxyl group as the alkali-soluble group. For the purpose of improving dry etching resistance, it is preferred for the resins containing a carboxyl group to have a monocyclic or polycyclic alicyclic hydrocarbon group. Specifically, copolymers of methacrylic ester having an alicyclic hydrocarbon structure not showing acid-decomposing property and (meth)acrylic acid, and resins of (meth)acrylic ester of alicyclic hydrocarbon group having carboxyl groups at terminals are exemplified.

[8] (H) Carboxylic Acid Onium Salt:

The positive resist composition in the invention may further contain a carboxylic acid onium salt as component (H).

As the carboxylic acid onium salt (H), carboxylic acid sulfonium salt, carboxylic acid iodonium salt, and carboxylic acid ammonium salt can be exemplified. As (H) carboxylic acid onium salt, iodonium salt and sulfonium salt are preferred. It is preferred that the carboxylate residue of (H) carboxylic acid onium salt does not contain an aromatic group and a carbon-carbon double bond. A particularly preferred anion moiety is a straight chain or branched, monocyclic or polycyclic alkylcarboxylate anion having from 1 to 30 carbon atoms, and the carboxylate anion in which a part or all of the alkyl groups are substituted with fluorine atoms are more preferred. An oxygen atom may be contained in the alkyl chain. By containing component (H), the transparency to the lights of 220 nm or less is ensured, sensitivity and resolution are increased, and condensation and rarefaction dependency and exposure margin are improved.

As anions of fluorine-substituted carboxylic acid, anions of fluoroacetic acid, difluoroacetic acid, trifluoro-acetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid are exemplified.

These carboxylic acid onium salts (H) can be synthesized by reacting sulfonium hydroxide, iodonium hydroxide, or ammonium hydroxide and carboxylic acid with silver oxide in an appropriate solvent.

The content of carboxylic acid onium salt (H) in the resist composition is from 0.1 to 20 mass % to all the solids content of the composition, preferably from 0.5 to 10 mass %, and more preferably from 1 to 7 mass %.

Other Additives:

If necessary, dyes, plasticizers, photosensitizers, compounds for accelerating dissolution in a developer, and transparency adjustors may further be added to the positive resist composition in the invention.

As the dissolution-accelerating compounds, e.g., phenolic compounds having a molecular weight of 1,000 or less, or alicyclic or aliphatic compounds having a carboxyl group are exemplified.

The phenolic compounds having a molecular weight of 1,000 or less can be easily synthesized with referring to the methods disclosed, e.g., in JP-A-4-122938, JP-A-2-28531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is not limited to these compounds.

Use Method:

The positive resist composition in the invention is used by dissolving each of the above components in a prescribed organic solvent, preferably dissolving in a mixed solvent as described above, and coating the solution on a prescribed support.

That is, the positive resist composition is coated on a substrate such as the one used in the production of precision integrated circuit elements (e.g., a silicon/silicon dioxide film) by an appropriate coating method with a spinner or a coater to thereby form a resist film.

The resist film is then subjected to exposure through a prescribed mask, baking, development and rinsing, whereby a good resist pattern can be obtained. As the exposure light, far ultraviolet rays of preferably 250 nm or less, more preferably 220 nm or less, are used.

Specifically, a KrF excimer laser (248 nm), an ArF excimer laser (193 nm), an $F_2$ excimer laser (157 nm), X-rays and electron beams are exemplified.

In exposure, immersion exposure may be performed via an immersion liquid.

An immersion liquid for use in immersion exposure is explained below. An immersion liquid for use in immersion exposure preferably has a temperature coefficient of refractive index as small as possible so as to be transparent to the exposure wavelength and to hold the distortion of optical image reflected on the resist to the minimum. In particular, when the exposure light source is an ArF excimer laser (wavelength: 193 nm), it is preferred to use water for easiness of availability and easy handling property, in addition to the above points.

When water is used as the immersion liquid, to reduce the surface tension of water and to increase the surface activity, a trace amount of additive (a liquid) that does not dissolve the resist layer on a wafer and has a negligible influence on the optical coating of the lower surface of a lens may be added. As such an additive, aliphatic alcohols having a refractive index almost equal to the refractive index of water is preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index of the liquid as a whole can be made extremely small. On the other hand, when impurities opaque to the light of 193 nm or a substance largely different from water in a refractive index are mixed, these substances bring about the distortion of the optical image reflected on the resist. Accordingly water is preferably distilled water. Further, pure water filtered through an ion exchange filter may be used.

When the positive resist composition in the invention is used for immersion exposure, the contact angle of the resist film with the immersion liquid is preferably 75° or more, more preferably from 75 to 120°, still more preferably from 80 to 120°, and especially preferably from 80 to 100°.

For bringing the contact angle into the above range, there are a method of hydrophobitizing the resin, and a method of using an additive for increasing the contact angle, or using a surfactant. There are cases where resist performance is influenced by the hydrophobitization of resins, so that it is preferred to use a method of using an additive for increasing the contact angle or a surfactant.

A film hardly soluble in an immersion liquid (hereinafter also referred to as "topcoat") may be provided between a resist film and an immersion liquid. The necessary functions required of the topcoat are the aptitude for coating on the upper layer of the resist, the transparency to radiation, particularly the transparency to the light of 193 nm, and the immersion liquid insolubility. It is preferred that the topcoat is not mixed with the resist and can be coated uniformly on the resist upper layer.

From the viewpoint of the transparency to 193 nm, polymers not containing aromatic compounds are preferred as the topcoat. Specifically, hydrocarbon polymers, acrylic ester polymers, polymethacrylic acid, polyacrylic acid, polyvinyl ether, silicon-containing polymers and fluorine-containing polymers are exemplified.

When the topcoat is peeled, a developer may be used, or a remover may be used separately. As the remover, solvents low in penetration into a resist are preferred. In view of capable of performing peeling process at the same time with the development process of the resist, peeling by an alkaline developer is preferred. From the viewpoint of performing peeling by an alkaline developer, the topcoat is preferably acidic, but from the viewpoint of non-intermixture with the resist, it may be neutral or alkaline.

Resolution increases when there is no difference in the refractive indexes between the topcoat and the immersion liquid. In the case where the exposure light source is an ArF excimer laser (wavelength: 193 nm), water is preferred as the immersion liquid, so that the refractive index of the topcoat for ArF immersion exposure is preferably near the refractive index of water (1.44). Further, from the viewpoint of the transparency and refractive index, the topcoat is preferably a thin film.

In a development process, a developer is used as follows. As the developer of the positive resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkaline aqueous solutions.

The alkali concentration of alkaline developers is generally from 0.1 to 20 mass %.

The pH of alkaline developers is generally from 10.0 to 15.0.

Pure water can be used as a rinsing liquid and an appropriate amount of surfactants may be added.

After development process or rinsing process, a process to remove the developer or rinsing liquid on the resist pattern can be performed by supercritical fluid.

The variations of performances that are seen when well known resists are applied to immersion exposure technique are due to the contact of the surface of a resist with an immersion liquid in exposure, and the similar tendency is seen in evaluation experiments approximately reproducing the exposure conditions of immersion exposure.

EXAMPLE

The invention will be described with reference to Examples but the invention is not limited thereto.

Synthesis Example 1

Synthesis of Resin (25) (a/b/c/d=30/10/10/50)
Having the Structure Shown Below Corresponding
to Formula (1) in JP-A-2000-241964

A mixture comprising norbornenecarboxylic acid t-butyl ester, norbornenecarboxylic acid, norbornenecarboxylic acid 2-hydroxyethyl ester and maleic anhydride was dissolved in tetrahydrofuran to prepare a solution having solids content of 50 mass %. The solution was put into a three-necked flask and heated at 60° C. under a nitrogen current. When the reaction temperature was stabilized, a radical polymerization initiator V-60 (a product of Wako Pure Chemical Co., Ltd.) was added to the reaction solution in an amount of 5 mol % and reaction was initiated. After heating for 6 hours, the reaction mixture was diluted with tetrahydrofuran by two times, and then the reaction mixture was put into hexane five times the volume of the reaction mixture to precipitate white powder. The white powder was dissolved in tetrahydrofuran again and the solution was put into hexane five times the volume of the solution to precipitate white powder. The precipitated powder was recovered by filtration and dried, whereby objective resin (25) was obtained.

It was found the molecular weight of the obtained resin (25) was 7,900 (weight average) in terms of polystyrene from the molecular weight analysis (RI analysis) by GPC.

The structures and weight average molecular weights of alicyclic hydrocarbon-based acid-decomposable resins (1) to (25) for use in Examples and Comparative Examples are shown below.

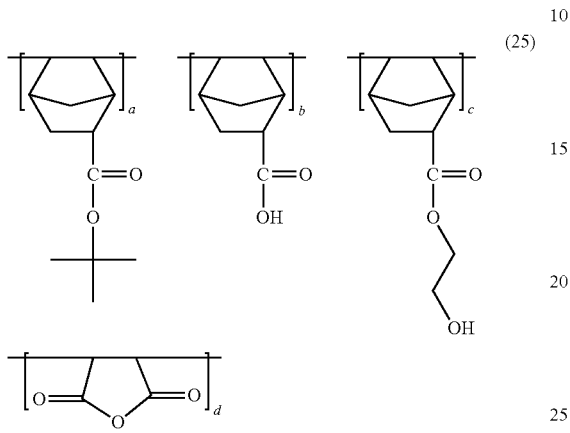

(25)

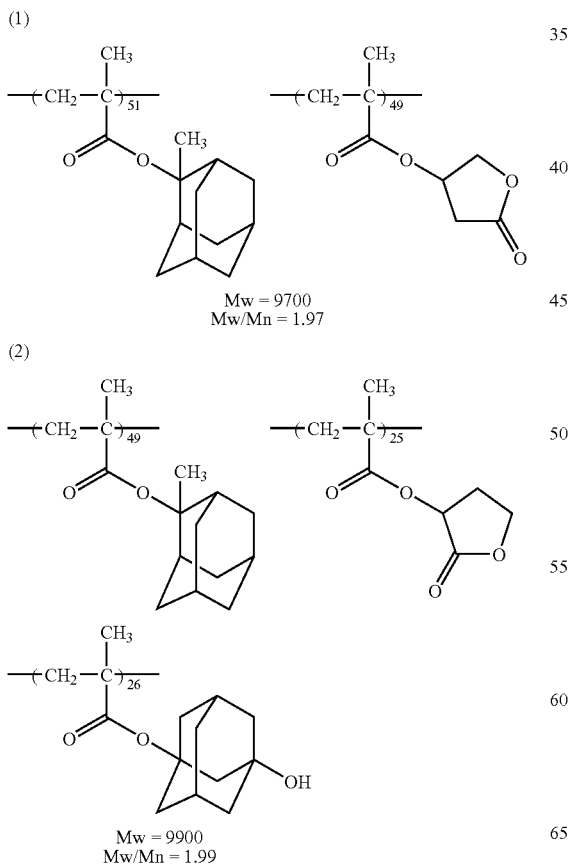

(1)

Mw = 9700
Mw/Mn = 1.97

(2)

Mw = 9900
Mw/Mn = 1.99

-continued

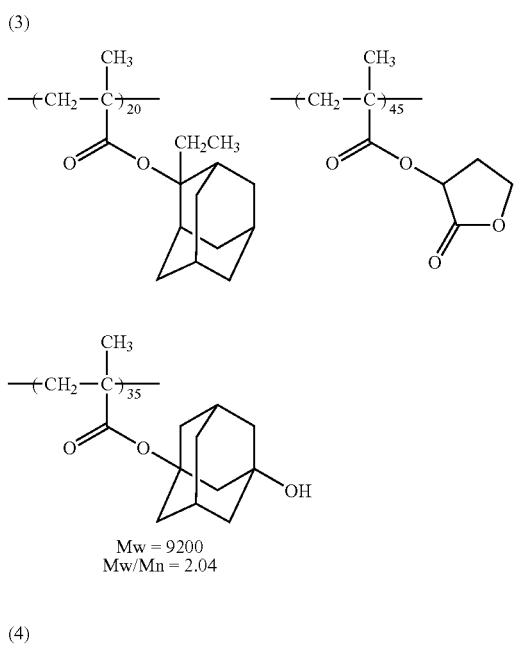

(3)

Mw = 9200
Mw/Mn = 2.04

(4)

Mw = 9700
Mw/Mn = 2.01

(5)

-continued
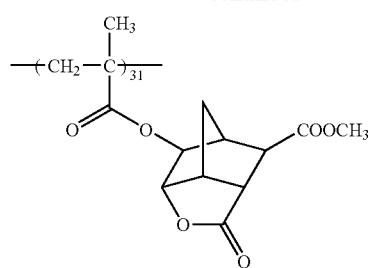
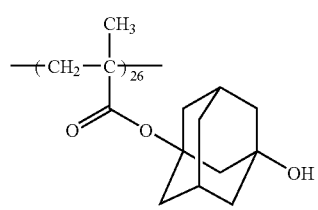
Mw = 8200
Mw/Mn = 1.91
(6)
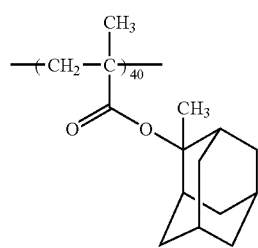
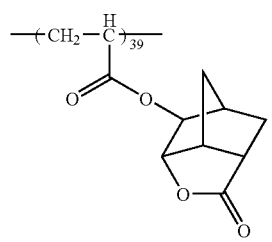
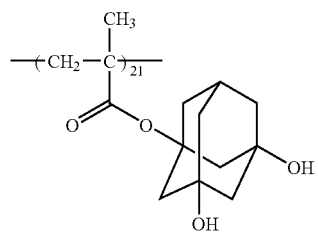
Mw = 9500
Mw/Mn = 2.07
(7)
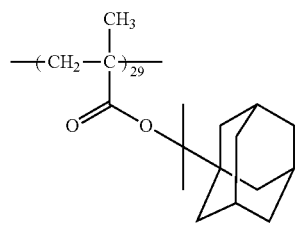
-continued
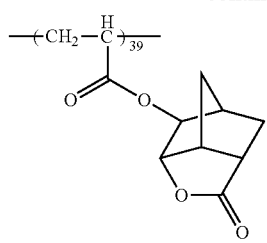
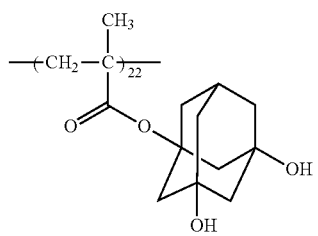
Mw = 8700
Mw/Mn = 1.98
(8)
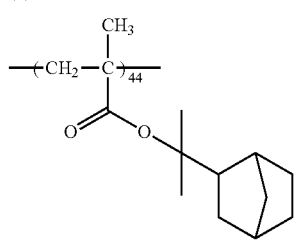
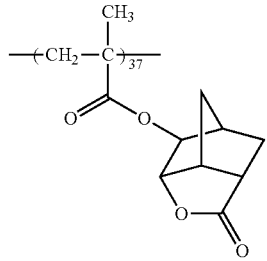
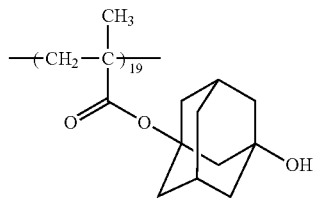
Mw = 10300
Mw/Mn = 2.16
(9)
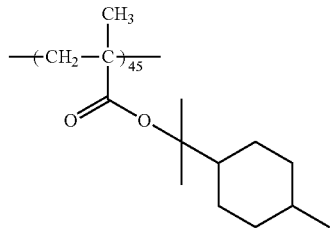

-continued
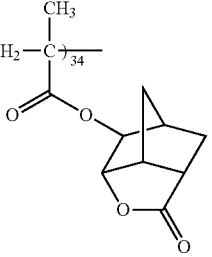
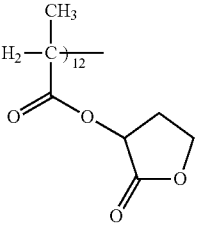
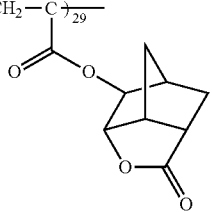
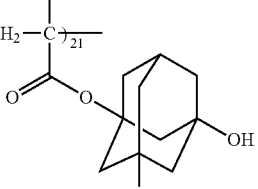
Mw = 11300
Mw/Mn = 2.21
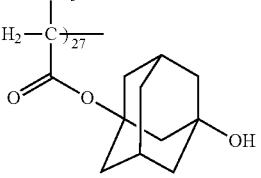
Mw = 10200
Mw/Mn = 2.31
(10)
(12)
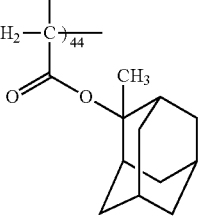
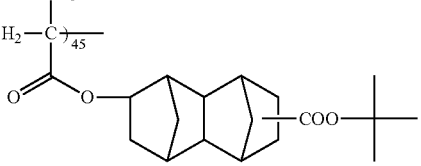
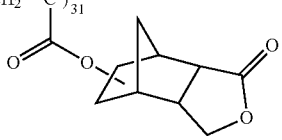
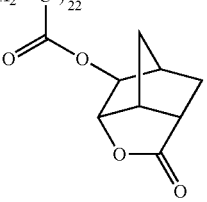
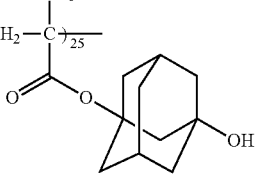
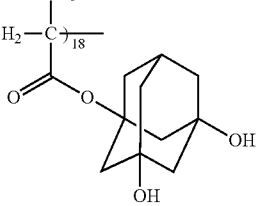 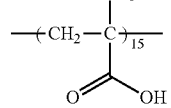
Mw = 8300
Mw/Mn = 1.97
Mw = 8700
Mw/Mn = 2.23
(11)
(13)
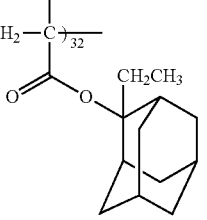
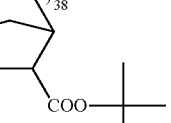 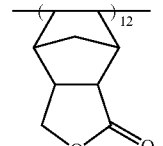
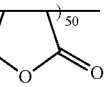
Mw = 7100
Mw/Mn = 2.42

-continued
(14)
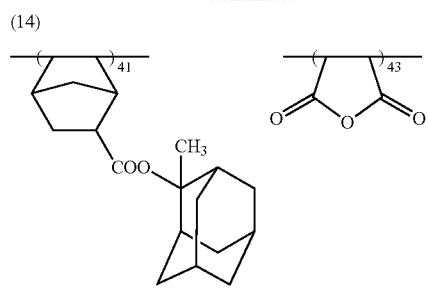
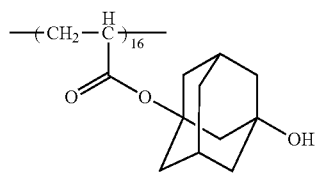
Mw = 8900
Mw/Mn = 2.19
(15)
Mw = 11100
Mw/Mn = 2.37
(16)
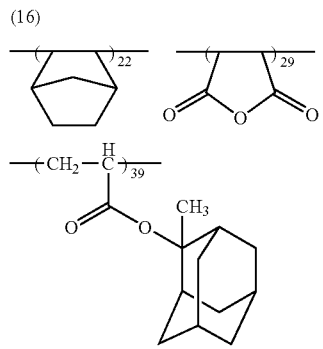
-continued
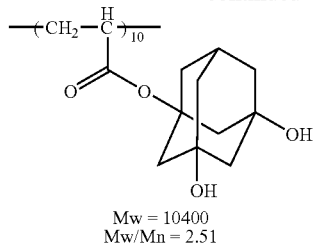
Mw = 10400
Mw/Mn = 2.51
(17)
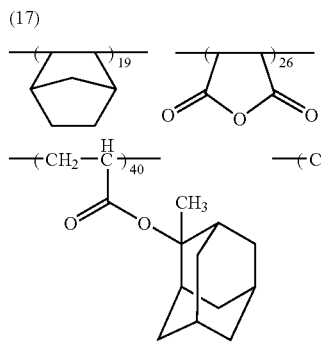
Mw = 10200
Mw/Mn = 2.51
(18)
Mw 7900
Mw/Mn = 2.33
(19)
Mw = 9300
Mw/Mn = 2.26

-continued

(20)
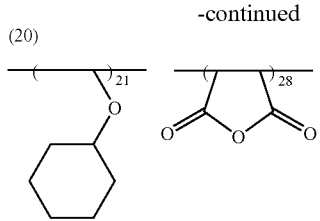

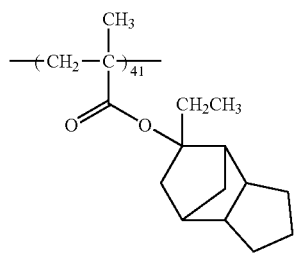

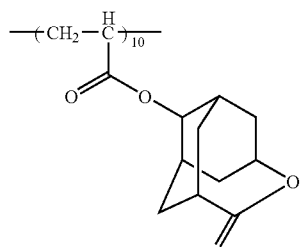

Mw = 9200
Mw/Mn = 2.49

(21)
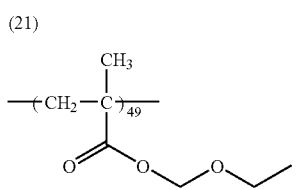

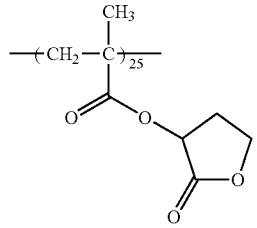

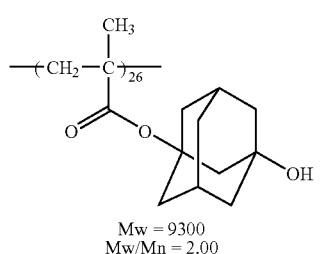

Mw = 9300
Mw/Mn = 2.00

(22)
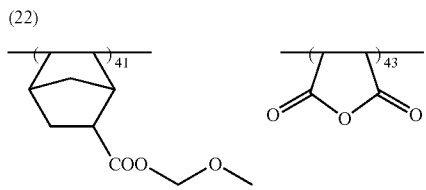

-continued

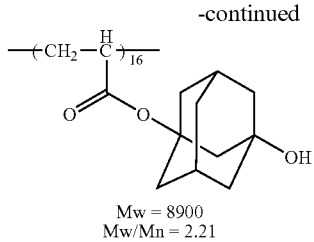

Mw = 8900
Mw/Mn = 2.21

(23)
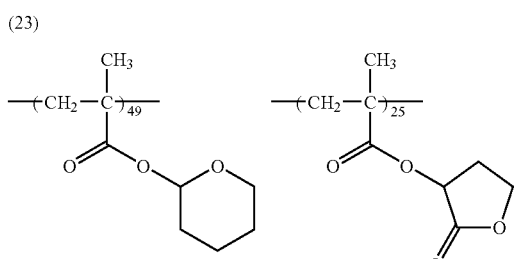

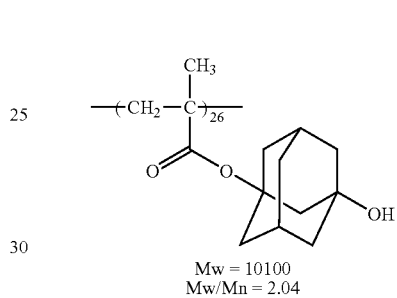

Mw = 10100
Mw/Mn = 2.04

(24)
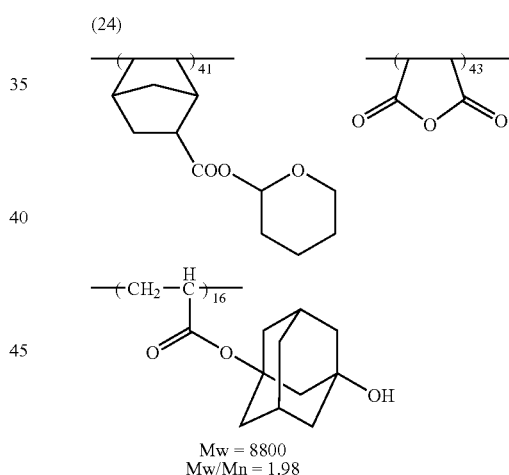

Mw = 8800
Mw/Mn = 1.98

Examples 1 to 29 and Comparative Examples 1 and 2

Preparation of Resist

The components of each sample shown in Tables 1 and 2 below were dissolved in a solvent to prepare a solution having solids content concentration of 7.5 mass %, and each solution was filtered through a polyethylene filter having a pore diameter of 0.1 μm, whereby a positive resist solution was obtained. Each of the thus prepared positive resist solutions was evaluated by the following method. The results obtained are shown in Tables 1 and 2.

TABLE 1

| Ex. No. | Resin (2 g) | Photo-Acid Generator (g) | Solvent (mass ratio) | Basic Compound (4 mg) (mass ratio) | Surfactant (mg) | Content of Fluorine Atom in Surfactant (mass %) | Development Defects Non-Exposed Area | Development Defects Exposed Area | $DOF_2/DOF_1$ | $D_2/D_1$ |
|---|---|---|---|---|---|---|---|---|---|---|
| Ex. 1 | 2 | z1 (0.06) | SL-4/5 = 40/60 | N-1 | W-2 (0.5) | 31 | $4.5 \times 10^{-3}$ | $5.0 \times 10^{-3}$ | 0.95 | 0.99 |
| Ex. 2 | 3 | z1 (0.06) | SL-4/5 = 40/50 | N-5 | W-3 (1.0) | 40 | $1.8 \times 10^{-3}$ | $2.4 \times 10^{-3}$ | 0.95 | 1.00 |
| Ex. 3 | 3 | z1 (0.06) | SL-4/5 = 50/50 | N-3 | W-1 (2.0) | 31 | $2.9 \times 10^{-3}$ | $2.9 \times 10^{-3}$ | 1.00 | 0.99 |
| Ex. 4 | 3 | z1 (0.06) | SL-4/5 = 70/30 | N-2 | W-1 (3.0) | 31 | $2.7 \times 10^{-3}$ | $4.9 \times 10^{-3}$ | 0.95 | 1.00 |
| Ex. 5 | 3 | z1 (0.06) | SL-4/7/8 = 76/19/5 | N-4 | W-3 (2.0) | 40 | $4.5 \times 10^{-3}$ | $3.1 \times 10^{-3}$ | 1.00 | 0.99 |
| Ex. 6 | 3 | z1 (0.06) | SL-4/5 = 90/10 | N-1/2 = 1/1 | W-4 (0.3) | 40 | $5.3 \times 10^{-3}$ | $3.7 \times 10^{-3}$ | 0.95 | 1.00 |
| Ex. 7 | 3 | z1 (0.03) z36 (0.06) | SL-4/5/7 = 63/27/10 | N-5 | W-4 (3.0) | 40 | $2.8 \times 10^{-3}$ | $4.4 \times 10^{-3}$ | 0.95 | 0.99 |
| Ex. 8 | 5 | z14 (0.06) | SL-4/5 = 80/20 | N-3 | W-1 (3.0) | 31 | $1.6 \times 10^{-3}$ | $4.8 \times 10^{-3}$ | 0.95 | 0.98 |
| Ex. 9 | 6 | z2 (0.06) | SL-4/5 = 50/50 | N-2/5 = 1/1 | W-1 (5.0) | 31 | $3.9 \times 10^{-3}$ | $1.8 \times 10^{-3}$ | 1.00 | 1.00 |
| Ex. 10 | 7 | z58 (0.06) | SL-4/5/9 = 76/19/5 | N-5 | W-3 (1.0) | 40 | $3.8 \times 10^{-3}$ | $4.4 \times 10^{-3}$ | 1.00 | 0.99 |
| Ex. 11 | 7 | z14 (0.03) z58 (0.25) | SL-4/5 = 70/30 | N-5 | W-4 (1.0) | 40 | $2.6 \times 10^{-3}$ | $3.5 \times 10^{-3}$ | 0.90 | 0.99 |
| Ex. 12 | 8 | z55 (0.06) | SL-4/5 = 70/30 | N-1 | W-4 (0.3) | 40 | $1.7 \times 10^{-3}$ | $3.3 \times 10^{-3}$ | 0.95 | 0.98 |
| Ex. 13 | 9 | z1 (0.06) | SL-4/5 = 60/40 | N-4 | W-3 (1.3) | 40 | $1.9 \times 10^{-3}$ | $2.2 \times 10^{-3}$ | 0.95 | 0.99 |
| Ex. 14 | 10 | z46 (0.1) | SL-4/5 = 90/10 | N-5/6 = 8/2 | W-3 (5.0) | 40 | $5.3 \times 10^{-3}$ | $5.1 \times 10^{-3}$ | 1.00 | 1.00 |
| Ex. 15 | 11 | z1 (0.06) | SL-4/5 = 40/60 | N-2 | W-2 (0.5) | 31 | $4.7 \times 10^{-3}$ | $3.9 \times 10^{-3}$ | 0.90 | 0.98 |

TABLE 2

| Ex. No. | Resin (2 g) | Photo-Acid Generator (g) | Solvent (mass ratio) | Basic Compound (4 mg) (mass ratio) | Surfactant (mg) | Content of Fluorine Atom in Surfactant (mass %) | Development Defects Non-Exposed Area | Development Defects Exposed Area | $DOF_2/DOF_1$ | $D_2/D_1$ |
|---|---|---|---|---|---|---|---|---|---|---|
| Ex. 16 | 12 | Z1 (0.06) | SL-4/5 = 70/30 | N-3/6 = 1/1 | W-3 (2.0) | 40 | $2.9 \times 10^{-3}$ | $2.4 \times 10^{-3}$ | 0.95 | 1.00 |
| Ex. 17 | 13 | Z1 (0.06) | SL-4/5/8 = 45/45/10 | N-3/5 = 7/3 | W-1 (1.0) | 31 | $2.6 \times 10^{-3}$ | $1.7 \times 10^{-3}$ | 0.90 | 0.99 |
| Ex. 18 | 14 | Z1 (0.06) | SL-4/5/2 = 57/38/5 | N-5 | W-1 (1.0) | 31 | $4.3 \times 10^{-3}$ | $2.9 \times 10^{-3}$ | 0.95 | 0.98 |
| Ex. 19 | 15 | Z1 (0.06) | SL-4/5 = 70/30 | N-4/5 = 1/1 | W-3 (3.0) | 40 | $5.1 \times 10^{-3}$ | $3.6 \times 10^{-3}$ | 0.95 | 1.00 |
| Ex. 20 | 16 | Z1 (0.06) | SL-4/5 = 40/60 | N-1 | W-3 (1.0) | 40 | $2.5 \times 10^{-3}$ | $1.8 \times 10^{-3}$ | 0.95 | 0.98 |
| Ex. 21 | 17 | Z1 (0.06) | SL-4/5/1 = 76/19/5 | N-3 | W-4 (3.0) | 40 | $1.8 \times 10^{-3}$ | $3.0 \times 10^{-3}$ | 1.00 | 1.00 |
| Ex. 22 | 18 | Z1 (0.06) | SL-4/5/3 = 45/45/10 | N-3 | W-3 (3.0) | 40 | $3.3 \times 10^{-3}$ | $3.7 \times 10^{-3}$ | 1.00 | 0.98 |
| Ex. 23 | 19 | Z1 (0.06) | SL-4/5 = 70/30 | N-2 | W-3 (2.0) | 40 | $2.0 \times 10^{-3}$ | $4.9 \times 10^{-3}$ | 0.95 | 0.98 |
| Ex. 24 | 20 | Z58 (0.06) | SL-4/5/2 = 57/38/5 | N-2 | W-1 (2.0) | 31 | $3.7 \times 10^{-3}$ | $4.3 \times 10^{-3}$ | 0.90 | 0.97 |
| Ex. 25 | 21 | Z59 (0.06) | SL-4/5 = 40/60 | N-1 | W-2 (5.0) | 31 | $2.3 \times 10^{-3}$ | $4.1 \times 10^{-3}$ | 0.95 | 0.97 |
| Ex. 26 | 22 | Z55 (0.06) | SL-4/5 = 60/40 | N-5 | W-3 (1.0) | 40 | $3.2 \times 10^{-3}$ | $2.3 \times 10^{-3}$ | 0.95 | 0.98 |
| Ex. 27 | 23 | Z52 (0.06) | SL-4/5 = 40/60 | N-1 | W-3 (0.5) | 40 | $4.2 \times 10^{-3}$ | $3.1 \times 10^{-3}$ | 1.00 | 0.97 |
| Ex. 28 | 24 | Z52 (0.06) | SL-4/5 = 70/30 | N-2 | W-4 (1.0) | 40 | $3.5 \times 10^{-3}$ | $3.2 \times 10^{-3}$ | 0.95 | 1.00 |
| Ex. 29 | 25 | Z1 (0.06) | SL-4/5 = 70/30 | N-5 | W-2 (0.5) | 31 | $1.9 \times 10^{-3}$ | $2.1 \times 10^{-3}$ | 1.00 | 0.99 |
| Comp. Ex. 1 | 3 | Z1 (0.06) | SL-4/5 = 60/40 | N-2 | W-5 (1.0) | 20 | 1.0 | 1.0 | 0.50 | 0.74 |
| Comp. Ex. 2 | 2 | Z2 (0.06) | SL-4/5 = 70/30 | N-5 | W-6 (1.0) | 27 | 0.94 | 0.91 | 0.45 | 0.72 |

The abbreviations in Tables 1 and 2 are as follows.
N-1: N,N-Dibutylaniline
N-2: N,N-Dipropylaniline
N-3: N,N-Dihydroxyethylaniline
N-4: 2,4,5-Triphenylimidazole
N-5: 2,6-Diisopropylaniline
N-6: Hydroxyantipyrine
W-1: PF636 (a product of OMNOVA) (fluorine surfactant)
W-2: PF6320 (a product of OMNOVA) (fluorine surfactant)
W-3: PF656 (a product of OMNOVA) (fluorine surfactant)
W-4: PF6520 (a product of OMNOVA) (fluorine surfactant)
W-5: Megafac F176 (a product of Dainippon Ink and Chemicals Inc.) (fluorine surfactant)
W-6: Fluorad FC 430 (a product of Sumitomo 3M Limited) (fluorine surfactant)

The structures of PF636, PF6320, PF656 and PF6520 are shown below.

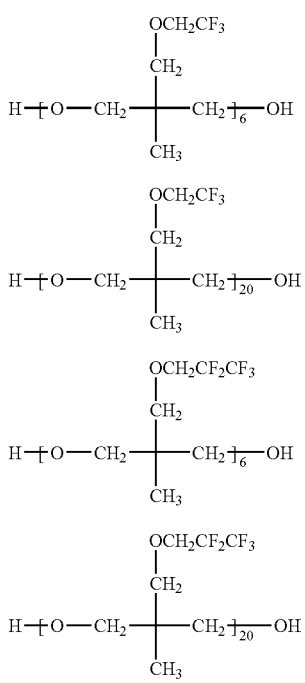

PF636
PF6320
PF656
PF6520

SL-1: Cyclopentanone
SL-2: Cyclohexanone
SL-3: 2-Methylcyclohexanone
SL-4: Propylene glycol monomethyl ether acetate
SL-5: Ethyl lactate
SL-6: Propylene glycol monomethyl ether
SL-7: 2-Heptanone
SL-8: γ-Butyrolactone
SL-9: Propylene carbonate <Test of Performance for Development Defects>
Evaluation Conditions of Unexposed Area:

Organic antireflection film ARC29A (manufactured by Nissan Chemical Industries, Ltd.) was coated on a silicone wafer, baked at 205° C. for 60 seconds to form an antireflection film having a thickness of 78 nm. The prepared positive resist solution was coated thereon and baked at 115° C. for 60 seconds to thereby form a resist film having a thickness of 200 nm The wafer not exposed was subjected to development with a tetramethyl-ammonium hydroxide aqueous solution (2.38%) for 30 seconds, rinsing with pure water, and then spin-drying. The wafer was analyzed with KLA2360 (a product of KLA Tencor Japan) (the conditions of evaluation are shown below). In the evaluation, the number of defects of the sample in Comparative Example 1 was standardized to 1. The smaller the value, the better is the performance for development defects.

Evaluation Conditions of KLA2360:
Pixel size: 0.25 μm
Threshold: 30
Imaging mode: BF Evaluation Condition of Exposed Area:

Organic antireflection film ARC29A (manufactured by Nissan Chemical Industries, Ltd.) was coated on a silicone wafer, baked at 205° C. for 60 seconds to form an antireflection film having a thickness of 78 nm. The prepared positive resist solution was coated thereon and baked at 115° C. for 60 seconds to thereby form a resist film having a thickness of 200 nm The wafer obtained was entirely exposed with an ArF excimer laser scanner (a product of ASLM, PAS5500/1100, NA: 0.75, σo/σi=0.85/0.55) by optimal exposure amount (Eopt) of each resist. The resist was baked at 120° C. for 60 seconds, and then subjected to development with a tetramethylammonium hydroxide aqueous solution (2.38 mass %) for 30 seconds, rinsing with pure water, and spin-drying. The entire exposed area of the wafer was analyzed with KLA-2360 (the conditions of evaluation were the same as above). In the evaluation, the number of defects of the sample in Comparative Example 1 was standardized to 1. The smaller the value, the better is the performance for development defects.

<Image Property Test>
Comparison of the Properties of the Time Subjected to and not Subjected to Water Treatment Before and after Exposure:
Exposure Condition 1:
(Evaluation of Exposure without Water Treatment Before and after Exposure (Ordinary Exposure Condition))

Organic antireflection film ARC29A (manufactured by Nissan Chemical Industries, Ltd.) was coated on a silicone wafer, baked at 205° C. for 60 seconds to form an antireflection film having a thickness of 78 nm. The prepared positive resist solution was coated thereon and baked at 115° C. for 60 seconds to thereby form a resist film having a thickness of 200 nm The wafer obtained was pattern-exposed with an ArF excimer laser scanner (a product of ASLM, PAS5500/1100, NA: 0.75, σo/σi=0.85/0.55) through a halftone phase shift mask having transmittance of 6%. The resist was baked at 120° C. for 60 seconds, and then subjected to development with a tetramethyl-ammonium hydroxide aqueous solution (2.38 mass %) for 30 seconds, rinsing with pure water, and spin-drying, whereby a resist pattern was obtained.

Exposure Condition 2:
(Evaluation of Exposure with Water Treatment Before and after Exposure)

Organic antireflection film ARC29A (manufactured by Nissan Chemical Industries, Ltd.) was coated on a silicone wafer, baked at 205° C. for 60 seconds to form an antireflection film having a thickness of 78 nm. The prepared positive resist solution was coated thereon and baked at 115° C. for 60 seconds to thereby form a resist film having a thickness of 200 nm After being subjected to water treatment with pure water for 60 seconds while forming a paddle, the wafer was pattern-exposed with an ArF excimer laser scanner (a product of ASLM, PAS5500/1100, NA: 0.75, σo/σi=0.85/0.55) through a halftone phase shift mask having transmittance of 6%. Water treatment with pure water was also carried out immediately after exposure for 60 seconds. The resist was baked at 120° C. for 60 seconds, and then subjected to development with a tetramethylammonium hydroxide aqueous solution (2.38 mass %) for 30 seconds, rinsing with pure water, and spin-drying, whereby a resist pattern was obtained.

Evaluations of DOF and Profile:

The resist pattern used for evaluation was a dense pattern having the ratio of a line of 90 nm and space of 1/1. The exposure amount (Eopt) for reproducing the mask size was obtained with an SEM (S-9260, a product of Hitachi, Ltd.), the range of DOF capable of reproducing 90 nm±10% of the mask size at Eopt was measured, and this was taken as DOF value.

At this time, the DOF value found by exposure conditions 1 was taken as $DOF_1$, the DOF value found by exposure conditions 2 was taken as $DOF_2$, and the ratio of $DOF_2$ to $DOF_1$, $DOF_2/DOF_1$, was defined. The nearer the ratio to 1, the better is the immersion exposure resistance, and smaller the value than 1, the worse is the immersion exposure resistance.

The cross-sectional shape of the line pattern at Eopt was observed with an SEM (S-4300, a product of Hitachi, Ltd.), and the wall angle was measured. At this time, the wall angle found by exposure conditions 1 was taken as $D_1$, that found by exposure conditions 2 was taken as $D_2$, and the ratio of $D_2$ to $D_1$, $D_2/D_1$, was defined. The nearer the ratio to 1, the better is the immersion exposure resistance, and smaller the value than 1, the worse is the immersion exposure resistance.

It can be seen from the results shown in Tables 1 and 2 that performance for development defects by ordinary exposure is improved according to the invention, and the invention can provide a positive resist composition free from deteriorations of DOF and profile when applied to immersion exposure.

Examples 30 to 40 and Comparative Examples 3 to 6

Preparation of Resist

The components of each sample shown in Table 3 below were dissolved in a solvent to prepare a solution having solids content concentration of 7.5 mass %, and each solution was filtered through a polyethylene filter having a pore diameter of 0.1 μm, whereby a positive resist solution was obtained. Each of the thus prepared positive resist solutions was evaluated by the following method. The results obtained are shown in Table 3.

W-5: Megafac F176 (a product of Dainippon Ink and Chemicals Inc.) (fluorine surfactant)
W-6: Fluorad FC 430 (a product of Sumitomo 3M Limited) (fluorine surfactant)
W-7: Surfynol 440 (a product of Shin-Etsu Chemical Co., Ltd.)
W-8: FTX-204D (a product of Neos)
W-9: FTX-208G (a product of Neos)
W-10: Compound Wa-1 shown below
W-11: Compound Wa-2 shown below
W-12: Compound Wa-3 shown below
W-13: Compound Wa-4 shown below

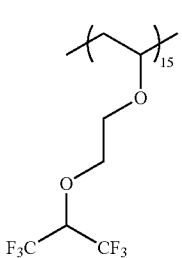

TABLE 3

| Ex No. | Resin (2 g) | Photo-Acid Generator (g) | Solvent (mass ratio) | Basic Compound (mg) | Surfactant (mg) | Content of Fluorine Atom in Surfactant (mass %) | Contact Angle (°) | Follow-up Ability of Water | Scum | DOF2/DOF1 | D2/D1 |
|---|---|---|---|---|---|---|---|---|---|---|---|
| Ex. 30 | (2) | z1 (0.08) | SL-4/5 = 1/1 | N-2 = 5 | W-1 (0.5) | 31 | 74 | ○ | ○ | 0.90 | 0.98 |
| Ex. 31 | (6) | z1 (0.10) | SL-4/6 = 3/2 | N-4 = 10 | W-9 (0.2) | 40 | 82 | ○ | ○ | 0.95 | 1.00 |
| Ex. 32 | (6) | z58 (0.05) | SL-4/5/7 = 5/4/1 | N-5 = 8 | W-4 (2.0) | 40 | 90 | ○ | ○ | 1.00 | 1.00 |
| Ex. 33 | (3) | z59 (0.12) | SL-4/5 = 1/1 | N-4 = 12 | W-8 (5.0) | 50 | 75 | ○ | ○ | 0.95 | 0.99 |
| Ex. 34 | (16) | z1 (0.05)/z36 (0.02) | SL-4/5 = 1/1 | N-4 = 12 | W-8 (5.0) | 50 | 75 | ○ | Δ | 0.95 | 0.98 |
| Ex. 35 | (8) | z1 (0.05)/z7 (0.02) | SL-4/6 = 3/2 | N-4 = 5 | W-11 (5.0) | 45 | 75 | ○ | ○ | 0.90 | 0.97 |
| Ex. 36 | (2) | z18 (0.10) | SL-4/5 = 1/1 | N-2 = 10 | W-12 (0.5) | 51 | 80 | ○ | ○ | 0.95 | 1.00 |
| Ex. 37 | (14) | z58 (0.06)/z30 (0.01) | SL-4/5 = 1/1 | N-2 = 10 | W-12 (0.5) | 51 | 80 | ○ | Δ | 0.90 | 0.98 |
| Ex. 38 | (7) | z55 (0.12) | SL-4/5 = 1/1 | N-2 = 5 | W-3 (0.3) | 40 | 76 | ○ | ○ | 0.95 | 0.99 |
| Ex. 39 | (2) | z58 (0.06)/z55 (0.06) | SL-4/6 = 4/1 | N-5 = 8 | W-2 (0.1) | 31 | 72 | ○ | ○ | 0.95 | 1.00 |
| Ex. 40 | (7) | z56 (0.15) | SL-4/6/2 = 5/4/1 | N-1 = 10 | W-13 (0.05) | 51 | 69 | ○ | ○ | 0.90 | 1.00 |
| Comp. Ex. 3 | (2) | z1 (0.08) | SL-4/6 = 3/2 | N-5 = 8 | W-7 (0.1) | 0 | 70 | x | ○ | 0.40 | 0.70 |
| Comp. Ex. 4 | (2) | z1 (0.08) | SL-4/6 = 3/2 | N-5 = 8 | W-10 (0.1) | 26 | 67 | x | ○ | 0.55 | 0.75 |
| Comp. Ex. 5 | (2) | z1 (0.08) | SL-4/5 = 1/1 | N-2 = 5 | W-10 (1.0) | 26 | 69 | ○ | x | 0.60 | 0.77 |
| Comp. Ex. 6 | (2) | z1 (0.08) | SL-4/5 = 1/1 | N-2 = 5 | W-7 (1.0) | 0 | 85 | ○ | x | 0.40 | 0.71 |

The abbreviations in Table 3 are as follows.
[Basic Compounds]
N-1: N,N-Dibutylaniline
N-2: N,N-Dipropylaniline
N-3: N,N-Dihydroxyethylaniline
N-4: 2,4,5-Triphenylimidazole
N-5: 2,6-Diisopropylaniline
N-6: Hydroxyantipyrine
[Surfactants]
W-1: PF636 (a product of OMNOVA) (fluorine surfactant)
W-2: PF6320 (a product of OMNOVA) (fluorine surfactant)
W-3: PF656 (a product of OMNOVA) (fluorine surfactant)
W-4: PF6520 (a product of OMNOVA) (fluorine surfactant)

-continued

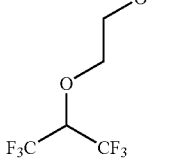

Wa-3

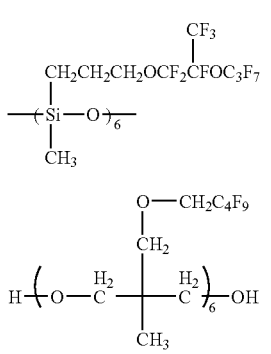

Wa-4

[Solvents]
SL-1: Cyclopentanone
SL-2: Cyclohexanone
SL-3: 2-Methylcyclohexanone
SL-4: Propylene glycol monomethyl ether acetate
SL-5: Ethyl lactate
SL-6: Propylene glycol monomethyl ether
SL-7: 2-Heptanone
SL-8: γ-Butyrolactone
SL-9: Propylene carbonate Contact Angle:
Each positive resist solution was coated on a silicone wafer and baked at 115° C. for 60 seconds to thereby form a resist film having a thickness of 200 nm. Water was dripped on the surface of the resist at room temperature (23° C.), and the contact angle was measured with a contact angle meter.

Follow-Up Ability of Water:
Contact Angle:
Each positive resist solution was coated on a silicone wafer and baked at 115° C. for 60 seconds to thereby form a resist film having a thickness of 200 nm. In the next place, as shown in FIG. 1, 15 ml of distilled water was dripped with a pipet on the central part of wafer 1 coated with the positive resist solution. Quartz plate 3 of 10 cm square having kite string 2 was put on the distilled water paddle and the entire space between wafer 1 and quartz plate 3 was filled with distilled water 4.

Subsequently, in the state that wafer 1 was fixed, kite string 2 attached to quartz plate 3 was wound on the rotating part of a motor rotating at a speed of 30 cm/sec, and the motor was switched on for 0.5 sec and quartz plate 3 was moved. After quartz plate 3 was moved, the amount of the distilled water remained under quartz plate 3 was judged by the following criteria, and this was taken as the follow-up ability of water.

In FIG. 2A to 2D are typical views showing various patterns looked down at quartz plate 3 from above after moving quartz plate 3. Oblique lines 6 shows the area of distilled water remained under quartz plate 3, and blank area 7 is the area where distilled water could not follow-up the movement of quartz plate 3 and air got into.

Figure 2A:
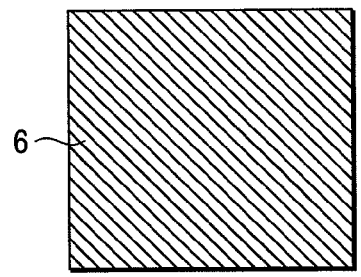
FIG. 2A to 2D is a schematic view showing the follow-up ability of water to the quartz plate.
Figure 2B:
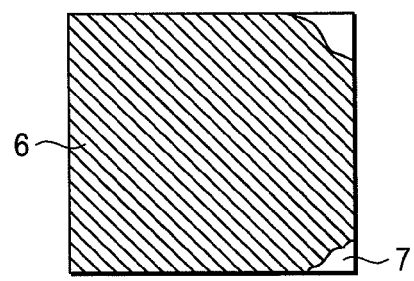
Figure 2C:
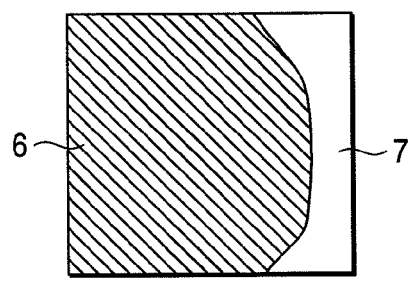
Figure 2D:
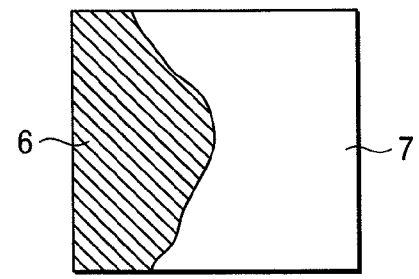

As shown in FIG. 2A, the case where distilled water remains on the whole surface after moving quartz plate 3 is graded o, the area where air is getting into stays 10% or so to the area of the quartz plate as shown in FIG. 2B is graded Δ, and the area where air is getting into is 20% or more to the area of the quartz plate as shown in FIG. 2C and FIG. 2D is graded x.

Occurrence of Scum:
Organic antireflection film ARC29A (manufactured by Nissan Chemical Industries, Ltd.) was coated on a silicone wafer, baked at 205° C. for 60 seconds to form an antireflection film having a thickness of 78 nm. The prepared positive resist solution was coated thereon and baked at 115° C. for 60 seconds to thereby form a resist film having a thickness of 200 nm The wafer obtained was pattern-exposed with an ArF excimer laser scanner (a product of ASLM, PAS5500/1100, NA: 0.75, σo/σi=0.85/0.55). The resist was baked at 120° C. for 60 seconds, and then subjected to development with a tetramethylammonium hydroxide aqueous solution (2.38 mass %) for 30 seconds, rinsing with pure water, and spin-drying, whereby a pattern was formed.

The evaluation was performed by the development scum on the resist pattern of line breadth of 0.15 μm. The case where scum is not observed is graded o, the case where considerable scum is observed is graded x, and the intermediate is graded Δ.

<Image Property Test>
Comparison of the Properties of the Time Subjected to and not Subjected to Water Treatment Before and after Exposure:
DOF and profile were evaluated in the same manner as in Example 1. The results of evaluations are shown in Table 3.

It is apparent from the results shown in Table 3 that the positive resist compositions in the invention are great in the contact angle with water, hydrophobic, excellent in follow-up ability of water, scum is difficult to occur, and free from the deterioration of DOF and profile when applied to immersion exposure.

The invention can provide a positive resist composition improved in performance for development defects by general exposure, free from the deterioration of DOF and profile when applied to immersion exposure, having good follow-up ability of water, and restrained in the occurrence of scum, and further provide a pattern-forming method using the same.

The entire disclosure of each and every foreign patent application from which the benefit of foreign priority has been claimed in the present application is incorporated herein by reference, as if fully set forth.

What is claimed is:
1. A positive photoresist composition comprising:
(A) a resin having a monocyclic or polycyclic alicyclic hydrocarbon structure and capable of decomposing by an action of an acid to increase a solubility of the resin in an alkaline developer;
(B) a compound capable of generating an acid upon treatment with one of an actinic ray and radiation; and
(F) a surfactant containing a fluorine atom in an amount of from 30 to 60 mass %, wherein the surfactant of component (F) is represented by formula (7):

(7)

wherein $Rfa_1$ represents a fluoroalkyl group; X represents an ether group or an oxyalkylene group; R represents an alkyl group; and m2 represents an integer of from 1 to 50.

2. The positive photoresist composition according to claim 1,
wherein the resin of component (A) comprises at least one repeating unit selected from the group consisting of: a repeating unit having a partial structure containing an alicyclic hydrocarbon represented by any of formulae (pI) to (pVI); and a repeating unit represented by formula (II-AB):

(pI)
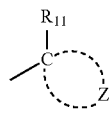

(pII)
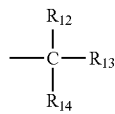

(pIII)
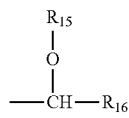

(pIV)
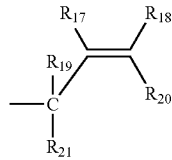

(pV)
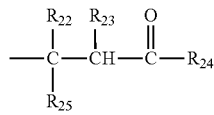

(pVI)
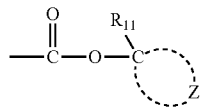

wherein $R_{11}$ represents a methyl group, an ethyl group, an n-propyl group, an isopropyl group, an n-butyl group, an isobutyl group or a sec-butyl group;

Z represents an atomic group necessary to form an alicyclic hydrocarbon group with a carbon atom;

$R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group;

$R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$, $R_{23}$, $R_{24}$ and $R_{25}$ each independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring;

(II-AB)
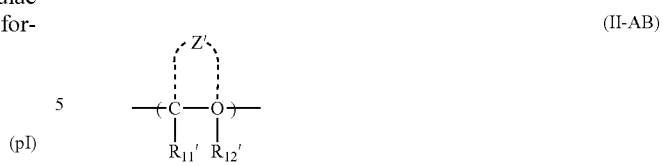

wherein $R_{11}'$ and $R_{12}'$ each independently represents a hydrogen atom, a cyano group, a halogen atom or an alkyl group; and Z' contains bonded two carbon atoms (C—C) and represents an atomic group for forming an alicyclic structure.

3. The positive photoresist composition according to claim 1,
wherein the resin of component (A) has properties (i) and (ii):
(i) the resin comprises a repeating unit having at least one lactone structure; and
(ii) a portion, which detaches from the resin of component (A) by an action of an acid, has an alicyclic hydrocarbon structure.

4. A pattern-forming method comprising:
forming a resist film with a positive photoresist composition according to claim 1;
exposing the resist film, so as to form an exposed resist film; and
developing the exposed resist film.

5. The positive photoresist composition according to claim 1, wherein the resin of component (A) does not contain an aromatic group.

6. The positive photoresist composition according to claim 5, wherein the resin of component (A) contains an acid-decomposable group contained within a repeating unit represented by formula (pA)

(pA)
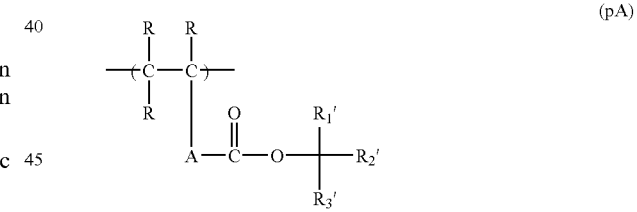

wherein R represents a hydrogen atom, a halogen atom, or a straight chain or branched alkyl group having from 1 to 4 carbon atoms, and a plurality of R's may be the same or different; A represents a single bond, a single group selected from the group consisting of an alkylene group, an ether group, a thioether group, a carbonyl group, an ester group, an amido group, a sulfonamido group, a urethane group and a urea group, wherein the alkylene group may have a substituent, or a combination of two or more groups selected from the group consisting of an alkylene group, an ether group, a thioether group, a carbonyl group, an ester group, an amido group, a sulfonamido group, a urethane group and a urea group, wherein the alkylene group may have a substituent; and $R_1'$, $R_2'$ and $R_3'$ each independently represents an alkyl group, a cycloalkyl group or an alkenyl group.

7. The positive photoresist composition according to claim 1, wherein the resin of component (A) comprises a repeating unit represented by formula (AI)

(AI)

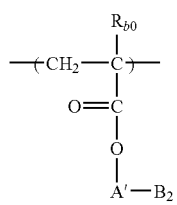

wherein $R_{b0}$ represents a hydrogen atom, a halogen atom, or an alkyl group having from 1 to 4 carbon atoms, and the alkyl group may have a substituent; A' represents a single bond, an ether group, an ester group, a carbonyl group, an alkylene group, or a divalent linking group combining any of these groups; and $B_2$ represents a group having a lactone structure represented by formula (Lc) or represented by any of formula (V-1) to (V-5)

(Lc)

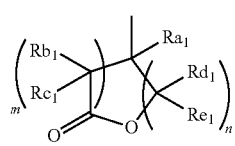

(V-1)

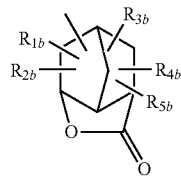

(V-2)

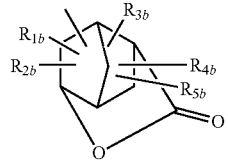

(V-3)

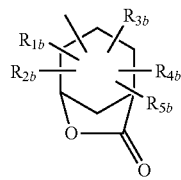

(V-4)

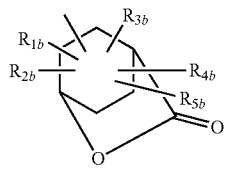

(V-5)

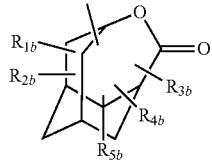

wherein in formula (Lc), $Ra_1$, $Rb_1$, $Rc_1$, $Rd_1$ and $Re_1$ each independently represents a hydrogen atom or an alkyl group; m and n each independently represents an integer of from 0 to 3, and m+n is from 2 to 6; and in formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group or an alkenyl group, and two of $R_{1b}$ to $R_{5b}$ may be bonded to each other to form a ring.

8. The positive photoresist composition according to claim 1, wherein the resin of component (A) comprises a repeating unit represented by formula (AII)

(AII)

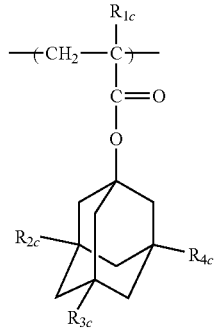

wherein $R_{1c}$ represents a hydrogen atom or a methyl group; $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

* * * * *